United States Patent
Won et al.

(10) Patent No.: US 11,932,715 B2
(45) Date of Patent: Mar. 19, 2024

(54) HARDMASK COMPOSITION AND METHOD OF FORMING PATTERNS

(71) Applicant: SAMSUNG SDI CO., LTD., Yongin-si (KR)

(72) Inventors: Donghoon Won, Suwon-si (KR); Yongsik Yoo, Suwon-si (KR); Hyunsoo Lee, Suwon-si (KR); Seil Choi, Suwon-si (KR); Huiseon Choe, Suwon-si (KR)

(73) Assignee: SAMSUNG SDI CO., LTD., Yongin-si (KR)

( * ) Notice: Subject to any disclaimer, the term of this patent is extended or adjusted under 35 U.S.C. 154(b) by 83 days.

(21) Appl. No.: 17/557,687

(22) Filed: Dec. 21, 2021

(65) Prior Publication Data
US 2022/0195082 A1 Jun. 23, 2022

(30) Foreign Application Priority Data
Dec. 22, 2020 (KR) .......................... 10-2020-0181154

(51) Int. Cl.
C08F 26/12 (2006.01)
G03F 7/11 (2006.01)
G03F 7/16 (2006.01)
G03F 7/20 (2006.01)
G03F 7/30 (2006.01)

(52) U.S. Cl.
CPC ................ C08F 26/12 (2013.01); G03F 7/11 (2013.01); G03F 7/167 (2013.01); G03F 7/20 (2013.01); G03F 7/30 (2013.01)

(58) Field of Classification Search
CPC ... C08F 26/12; G03F 7/11; G03F 7/20; G03F 7/094; C08G 61/124; H01L 21/31144; H01L 21/32139
See application file for complete search history.

(56) References Cited

U.S. PATENT DOCUMENTS

| | | | | |
|---|---|---|---|---|
| 2011/0309338 A1* | 12/2011 | Iwakuma | ............. | C07D 401/14 546/276.7 |
| 2012/0181513 A1* | 7/2012 | Yang | .................... | C08G 61/122 526/261 |
| 2020/0333709 A1 | 10/2020 | Kori et al. | | |

FOREIGN PATENT DOCUMENTS

| | | | | | |
|---|---|---|---|---|---|
| CN | 104812729 A | | 7/2015 | | |
| CN | 108912329 A | * | 11/2018 | ......... | C08G 73/0688 |
| CN | 108912329 A | | 11/2018 | | |
| CN | 110383173 A | | 10/2019 | | |
| CN | 111029579 A | * | 4/2020 | ......... | H01M 10/054 |
| JP | 2008-129433 A | | 6/2008 | | |
| JP | 2019-194693 A | | 11/2019 | | |
| KR | 10-2017-0005636 A | | 1/2017 | | |
| KR | 10-2017-0047745 A | | 5/2017 | | |
| KR | 10-2020-0007269 A | | 1/2020 | | |
| KR | 10-2020-0121758 A | | 10/2020 | | |
| KR | 2021044590 A | * | 4/2021 | ......... | C07D 487/22 |
| WO | WO 2010-147155 A1 | | 12/2010 | | |
| WO | WO-2015022835 A1 | * | 2/2015 | ......... | C07D 401/14 |
| WO | WO 2018-164267 A1 | | 9/2018 | | |
| WO | WO-2018164267 A1 | * | 9/2018 | ............. | C08G 61/04 |

OTHER PUBLICATIONS

Notice of Reasons for Refusal for Japanese Patent Application No. 2021-207165 (dated 2022).*
"Carbazole-bearing Porous Organic polymers with mulberry-like Morphology for Efficient Iodine Capture", Shaohui Xiong, Xiang Tang, Chunyue Pan, Liang Li, Juntao Tang, and Guipeng Yu, ACS Appl. Mater. Interfaces 2019, 11, 30, 27335-27342 Publication Date:Jun. 24, 2019 (Year: 2019).*
ACS Appl. Mater. Interfaces 2019.
ACS Appl. Mater. Interfaces 2015, 7, 11127-11133.
Journal of Electroanalytical Chemistry 848 (2019) 113296.
Taiwanese Office Action (including a search report) dated Sep. 5, 2023, of the corresponding Taiwanese Patent Application No. 110147874.
Korean Office Action dated Jan. 4, 2024, of the corresponding Korean Patent Application No. 10-2020-0181154.

* cited by examiner

*Primary Examiner* — Mark F. Huff
*Assistant Examiner* — Alexander Nicholas Lee
(74) *Attorney, Agent, or Firm* — Lee IP Law, P.C.

(57) ABSTRACT

A hardmask composition and a method of forming patterns using the hardmask composition, the composition including a polymer including a moiety derived from a compound represented by Chemical Formula 1; and a solvent:

[Chemical Formula 1]

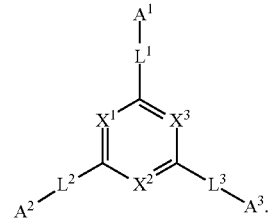

17 Claims, No Drawings

HARDMASK COMPOSITION AND METHOD OF FORMING PATTERNS

CROSS-REFERENCE TO RELATED APPLICATION

This application claims priority to and the benefit of Korean Patent Application No. 10-2020-0181154 filed in the Korean Intellectual Property Office on Dec. 22, 2020, the entire contents of which are incorporated herein by reference.

BACKGROUND

1. Field

Embodiments relate to a hardmask composition and a method of forming patterns using the hardmask composition.

2. Description of the Related Art

Recently, the semiconductor industry has developed to an ultrafine technique having a pattern of several to several tens nanometer size. Such ultrafine technique may utilize effective lithographic techniques.

One lithographic technique may include forming a material layer on a semiconductor substrate, coating a photoresist layer thereon, exposing and developing to form a photoresist pattern, and then etching the material layer using the photoresist pattern as a mask.

SUMMARY

The embodiments may be realized by providing a hardmask composition including a polymer including a moiety derived from a compound represented by Chemical Formula 1; and a solvent,

[Chemical Formula 1]

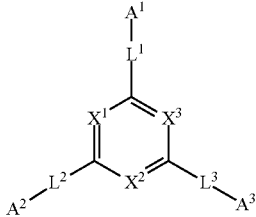

wherein, in Chemical Formula 1, $X^1$ to $X^3$ are each independently N or $CR^a$, in which $R^a$ is hydrogen, a substituted or unsubstituted C1 to C30 alkyl group, a substituted or unsubstituted C2 to C30 alkenyl group, a substituted or unsubstituted C2 to C30 alkynyl group, a substituted or unsubstituted C6 to C30 aryl group, a substituted or unsubstituted C2 to C30 heterocyclic group, or a combination thereof, $A^1$ to $A^3$ are each independently a substituted or unsubstituted C2 to C40 heterocyclic group, and $L^1$ to $L^3$ are each independently a single bond, a substituted or unsubstituted C6 to C30 arylene group, or a combination thereof.

The embodiments may be realized by providing a method of forming patterns, the method including applying the hardmask composition according to an embodiment on a material layer and heat-treating the resultant to form a hardmask layer, forming a photoresist layer on the hardmask layer, exposing and developing the photoresist layer to form a photoresist pattern, selectively removing the hardmask layer using the photoresist pattern to expose a portion of the material layer, and etching an exposed portion of the material layer.

DETAILED DESCRIPTION

Example embodiments will now be described more fully hereinafter; however, they may be embodied in different forms and should not be construed as limited to the embodiments set forth herein. Rather, these embodiments are provided so that this disclosure will be thorough and complete, and will fully convey exemplary implementations to those skilled in the art.

It will also be understood that when a layer or element is referred to as being "on" another layer or element, it can be directly on the other layer or element, or intervening layers may also be present. In addition, it will also be understood that when a layer is referred to as being "between" two layers, it can be the only layer between the two layers, or one or more intervening layers may also be present.

As used herein, when a definition is not otherwise provided, "substituted" refers to replacement of a hydrogen atom of a compound by a substituent selected from deuterium, a halogen atom (F, Br, Cl, or I), a hydroxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid group or a salt thereof, a C1 to C30 alkyl group, a C2 to C30 alkenyl group, a C2 to C30 alkynyl group, a C6 to C30 aryl group, a C7 to C30 arylalkyl group, a C1 to C30 alkoxy group, a C1 to C20 heteroalkyl group, a C3 to C20 heteroarylalkyl group, a C3 to C30 cycloalkyl group, a C3 to C15 cycloalkenyl group, a C6 to C15 cycloalkynyl group, a C2 to C30 heterocyclic group, and a combination thereof.

In addition, two adjacent substituents of the substituted hydroxy group, nitro group, cyano group, amino group, azido group, amidino group, hydrazino group, hydrazono group, carbonyl group, carbamyl group, thiol group, ester group, carboxyl group or salt thereof, sulfonic acid group or salt thereof, phosphoric acid group or salt thereof, C1 to C30 alkyl group, C2 to C30 alkenyl group, C2 to C30 alkynyl group, C6 to C30 aryl group, C7 to C30 arylalkyl group, C1 to C30 alkoxy group, C1 to C30 heteroalkyl group, C3 to C30 heteroarylalkyl group, C3 to C30 cycloalkyl group, C3 to C15 cycloalkenyl group, C6 to C15 cycloalkynyl group, and C2 to C30 heterocyclic group may be fused to form a ring. For example, the substituted C6 to C30 aryl group may be fused with another adjacent substituted C6 to C30 aryl group to form a substituted or unsubstituted fluorene ring.

As used herein, when a definition is not otherwise provided, "hetero" refers to one including 1 to 3 heteroatoms selected from N, O, S, Se, and P.

Unless otherwise defined herein, "heteroalkyl group" may have a concept including an alkyl group including an ether moiety, and may include, for example, an alkyl group substituted with an alkoxy group, and specifically, a methoxymethoxy group, a methoxyethoxy group, a methoxypropoxy group, methoxybutoxy group, an ethoxymethoxy group, an ethoxyethoxy group, an ethoxypropoxy group, an ethoxybutoxy group, a propoxymethoxy group, a propoxyethoxy group, a propoxypropoxy group, a propoxybutoxy group, a butoxymethoxy group, a butoxyethoxy group, a butoxypropoxy group, or butoxybutoxy group.

As used herein, "aryl group" refers to a group including at least one hydrocarbon aromatic moiety, and includes hydrocarbon aromatic moieties linked by a single bond and hydrocarbon aromatic moieties fused directly or indirectly to provide a non-aromatic fused ring. The aryl group may include a monocyclic, polycyclic, or fused polycyclic (i.e., rings sharing adjacent pairs of carbon atoms) functional group.

As used herein, "heterocyclic group" is a concept including a heteroaryl group, and may include at least one hetero atom selected from N, O, S, P, and Si instead of carbon (C) in a cyclic compound such as an aryl group, a cycloalkyl group, a fused ring thereof, or a combination thereof. When the heterocyclic group is a fused ring, the entire ring or each ring of the heterocyclic group may include one or more heteroatoms.

More specifically, the substituted or unsubstituted aryl group may be a substituted or unsubstituted phenyl group, a substituted or unsubstituted naphthyl group, a substituted or unsubstituted anthracenyl group, a substituted or unsubstituted phenanthryl group, a substituted or unsubstituted fluorenyl group, a substituted or unsubstituted naphthacenyl group, a substituted or unsubstituted pyrenyl group, a substituted or unsubstituted biphenyl group, a substituted or unsubstituted terphenyl group, a substituted or unsubstituted quaterphenyl group, a substituted or unsubstituted chrysenyl group, a substituted or unsubstituted triphenylenyl group, a substituted or unsubstituted perylenyl group, a substituted or unsubstituted indenyl group, a combination thereof, or a combined fused ring of the foregoing groups, but is not limited thereto.

More specifically, the substituted or unsubstituted heterocyclic group may be a substituted or unsubstituted furanyl group, a substituted or unsubstituted thiophenyl group, a substituted or unsubstituted pyrrolyl group, a substituted or unsubstituted pyrazolyl group, a substituted or unsubstituted imidazolyl group, a substituted or unsubstituted triazolyl group, a substituted or unsubstituted oxazolyl group, a substituted or unsubstituted thiazolyl group, a substituted or unsubstituted oxadiazolyl group, a substituted or unsubstituted thiadiazolyl group, a substituted or unsubstituted pyridinyl group, a substituted or unsubstituted pyrimidinyl group, a substituted or unsubstituted pyrazinyl group, a substituted or unsubstituted triazinyl group, a substituted or unsubstituted benzofuranyl group, a substituted or unsubstituted benzothiophenyl group, a substituted or unsubstituted benzimidazolyl group, a substituted or unsubstituted indolyl group, a substituted or unsubstituted quinolinyl group, a substituted or unsubstituted isoquinolinyl group, a substituted or unsubstituted quinazolinyl group, a substituted or unsubstituted quinoxalinyl group, a substituted or unsubstituted naphthyridinyl group, a substituted or unsubstituted benzoxazinyl group, a substituted or unsubstituted benzthiazinyl group, a substituted or unsubstituted acridinyl group, a substituted or unsubstituted phenazinyl group, a substituted or unsubstituted phenothiazinyl group, a substituted or unsubstituted phenoxazinyl group, a substituted or unsubstituted dibenzofuranyl group, a substituted or unsubstituted dibenzothiphenyl group, a substituted or unsubstituted carbazolyl group, a substituted or unsubstituted pyridoindolyl group, a substituted or unsubstituted benzopyridooxazinyl group, a substituted or unsubstituted benzopyridothiazinyl group, a substituted or unsubstituted 9,9-dimethyl9,10dihydroacridinyl group, a combination thereof, or a combined fused ring of the foregoing groups, but is not limited thereto. As used herein, the term "or" is not an exclusive term, e.g., "A or B" would include A, B, or A and B.

As used herein, when specific definition is not otherwise provided, the term "combination" refers to mixing or copolymerization.

As used herein, the polymer is meant to include an oligomer and a polymer.

Hereinafter, a hardmask composition according to an embodiment is described.

The hardmask composition according to an embodiment may include a polymer and a solvent.

The polymer may include a moiety derived from a compound including a core that is an aromatic ring or a heterocycle, and a plurality of substituents substituted on the core and including a heterocycle (e.g., heterocyclic group). The core may be a hexagonal or 6-membered ring, e.g., a benzene ring or a 6-membered heterocycle including at least one nitrogen atom. The compound including the moiety may include an aromatic ring or a heterocycle having a high carbon content in both the core and the substituent, and the polymer including the moiety derived from the compound may form a hard layer, resulting in high corrosion resistance.

In an implementation, the plurality of substituents substituted on the core and including a heterocycle may include a heterocycle at a terminal end, and a number of substituents may be three. In an implementation, a stacking interaction between the polymers may be prevented, and an attractive force between the polymers may be reduced, so that the solubility of the polymer may be improved.

In an implementation, the polymer may include a moiety derived from a compound represented by Chemical Formula 1.

[Chemical Formula 1]

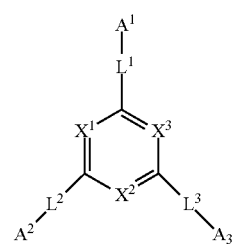

In Chemical Formula 1, $X^1$ to $X^3$ may each independently be, e.g., N or $CR^a$. $R^a$ may be or may include, e.g., hydrogen, a substituted or unsubstituted C1 to C30 alkyl group, a substituted or unsubstituted C2 to C30 alkenyl group, a substituted or unsubstituted C2 to C30 alkynyl group, a substituted or unsubstituted C6 to C30 aryl group, a substituted or unsubstituted C2 to C30 heterocyclic group, or a combination thereof.

$A^1$ to $A^3$ may each independently be or include, e.g., a substituted or unsubstituted C2 to C40 heterocyclic group.

$L^1$ to $L^3$ may each independently be or include, e.g., a single bond, a substituted or unsubstituted C6 to C30 arylene group, or a combination thereof.

In an implementation, $X^1$ to $X^3$ may be the same. In an implementation, all of $X^1$ to $X^3$ may be N or all of $X^1$ to $X^3$ may be $CR^a$.

In an implementation, $R^a$ may be hydrogen.

In an implementation, $A^1$ to $A^3$ may each independently include, e.g., a pentagonal or 5-membered heterocyclic group (e.g., may include a 5-membered heterocyclic ring). In an implementation, $A^1$ to $A^3$ may each independently include, e.g., a pentagonal heterocycle including a nitrogen atom.

In an implementation, $A^1$ to $A^3$ may each independently be, e.g., a single ring or a polycyclic ring, and the polycyclic ring may be, e.g., a condensed or fused ring.

In an implementation, $A^1$ to $A^3$ may each independently be, e.g., a substituted or unsubstituted pyrrole, a substituted or unsubstituted indole, or a substituted or unsubstituted carbazole.

In an implementation, $A^1$ to $A^3$ may be the same or different from each other. In an implementation, $A^1$ to $A^3$ may be the same.

In an implementation, in the definitions of $L^1$ to $L^3$, the substituted or unsubstituted C6 to C30 arylene group may be a divalent non-condensed aromatic ring group, a divalent condensed aromatic ring group, a divalent group in which aromatic moieties are linked by a single bond, a divalent group in which each ring condensed to two non-parallel sides of a benzene ring is fused, a divalent group in which each ring condensed to two non-parallel sides of a benzene ring is linked by a single bond or a double bond, or a combination thereof.

In an implementation, $L^1$ to $L^3$ may each independently be a single bond, a substituted or unsubstituted phenylene group, or a divalent group including substituted or unsubstituted benzene moieties bonded through a single bond. Accordingly, a high degree of rotational freedom of the compound may be secured, and thus by securing a high degree of rotational freedom, it may be more effectively applied to a solution process such as spin coating. In an implementation, the aromatic ring and the heterocycle having a high carbon content may be linked by a single bond, the carbon content of the polymer may be increased to form a hard layer, and thus higher corrosion resistance may be imparted.

In an implementation, $L^1$ to $L^3$ may each independently be, e.g., a single bond, a substituted or unsubstituted phenylene group, a substituted or unsubstituted biphenylene group, a substituted or unsubstituted terphenylene group, a substituted or unsubstituted quarterphenylene group, or a substituted or unsubstituted quinquephenylene group.

In an implementation, $L^1$ to $L^3$ may each independently be, e.g., a single bond, a substituted or unsubstituted phenylene group, a substituted or unsubstituted biphenylene group, substituted or unsubstituted para-terphenylene group, a substituted or unsubstituted para-quaterphenylene group, or a substituted or unsubstituted para-quinquephenylene group.

In an implementation, $L^1$ to $L^3$ may each independently be, e.g., a group represented by Chemical Formula 3.

{Chemical Formula 3}

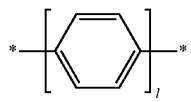

In Chemical Formula 3, $l$ may be, e.g., an integer of 0 to 4.

* is a linking point with other moieties in the compound represented by Chemical Formula 1.

In an implementation, $l$ may be an integer of 0 to 2, e.g., 0 or 1.

In an implementation, $L^1$ to $L^3$ may be the same or different from each other. In an implementation, $L^1$ to $L^3$ may be the same.

In an implementation, the compound represented by Chemical Formula 1 may be represented by, e.g., Chemical Formula 2.

[Chemical Formula 2]

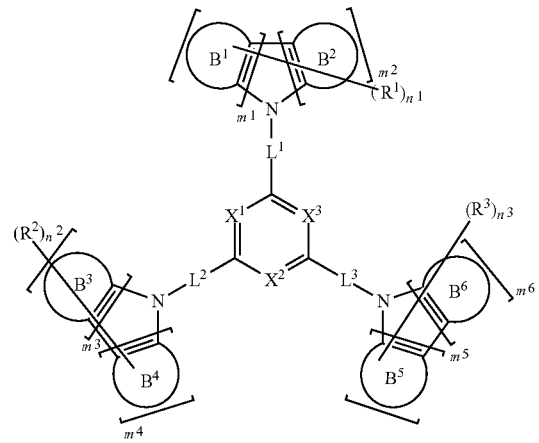

In Chemical Formula 2, $X^1$ to $X^3$, and $L^1$ to $L^3$ may each be defined the same as those described above.

$B^1$ to $B^6$ may each independently be, e.g., a C6 to C30 aromatic ring.

$R^1$ to $R^3$ may each independently be or include, e.g., a substituted or unsubstituted C1 to C30 alkyl group, a substituted or unsubstituted C2 to C30 alkenyl group, a substituted or unsubstituted C2 to C30 alkynyl group, a substituted or unsubstituted C6 to C30 aryl group, a substituted or unsubstituted C2 to C30 heterocyclic group, or a combination thereof.

$m^1$ to $m^6$ may each independently be, e.g., 0 or 1.

$n^1$ to $n^3$ may each independently be, e.g., an integer of 0 to 4.

In an implementation, $B^1$ to $B^6$ may each independently be, e.g., a benzene ring; a fused ring in which two or more aromatic rings are fused; or a non-fused ring in which two or more aromatic rings are linked by a single bond.

In an implementation, $B^1$ to $B^6$ may each independently be, e.g., a group or moiety of a group of Group 1.

[Group 1]

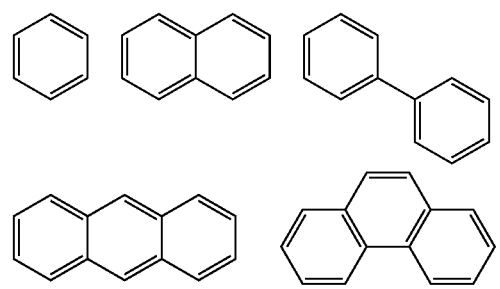

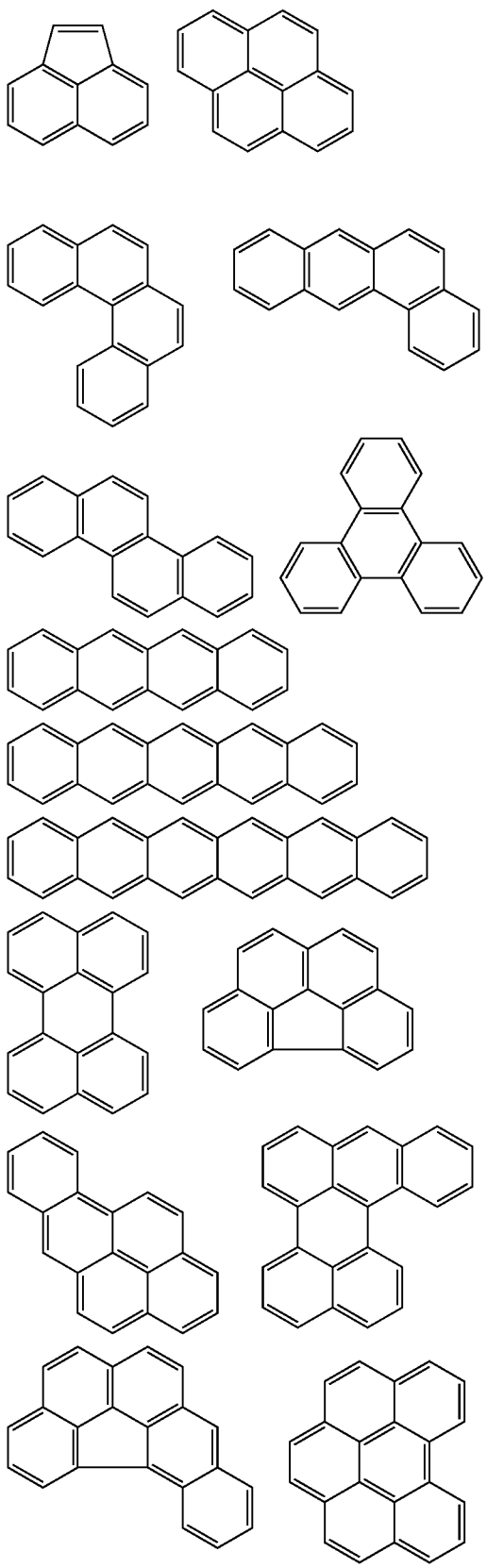

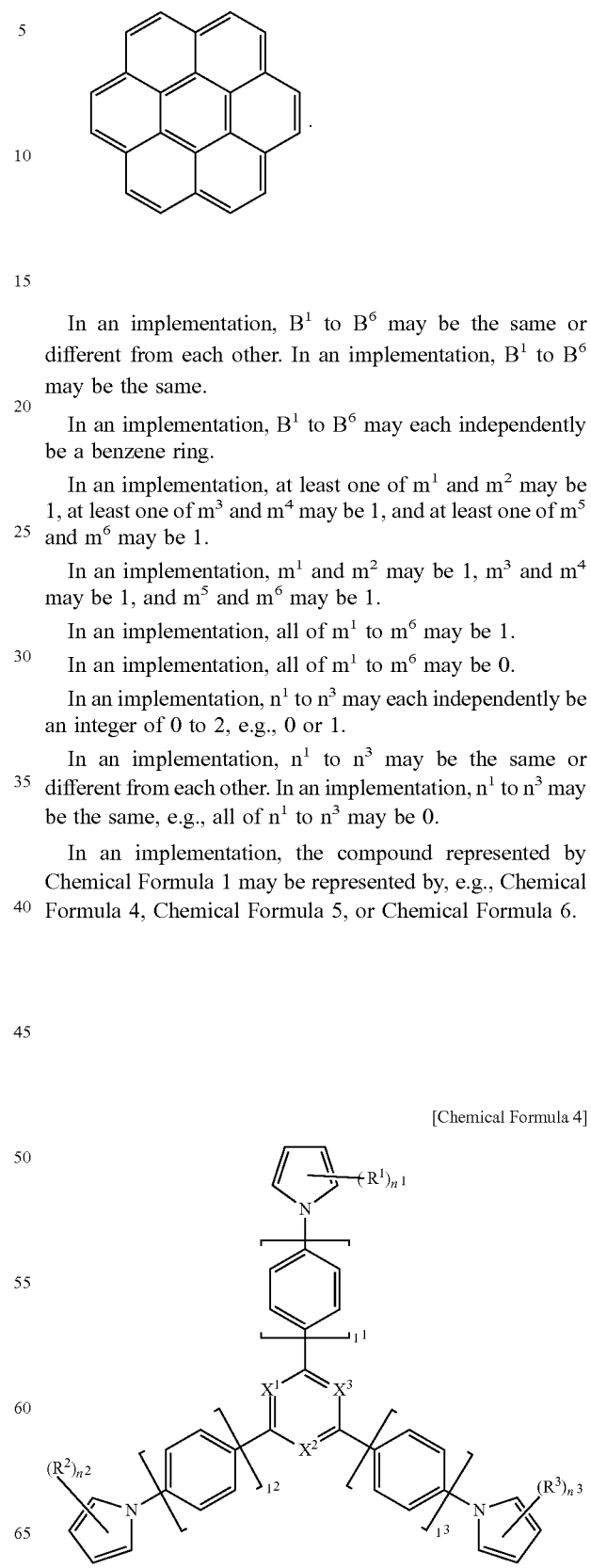

In an implementation, $B^1$ to $B^6$ may be the same or different from each other. In an implementation, $B^1$ to $B^6$ may be the same.

In an implementation, $B^1$ to $B^6$ may each independently be a benzene ring.

In an implementation, at least one of $m^1$ and $m^2$ may be 1, at least one of $m^3$ and $m^4$ may be 1, and at least one of $m^5$ and $m^6$ may be 1.

In an implementation, $m^1$ and $m^2$ may be 1, $m^3$ and $m^4$ may be 1, and $m^5$ and $m^6$ may be 1.

In an implementation, all of $m^1$ to $m^6$ may be 1.

In an implementation, all of $m^1$ to $m^6$ may be 0.

In an implementation, $n^1$ to $n^3$ may each independently be an integer of 0 to 2, e.g., 0 or 1.

In an implementation, $n^1$ to $n^3$ may be the same or different from each other. In an implementation, $n^1$ to $n^3$ may be the same, e.g., all of $n^1$ to $n^3$ may be 0.

In an implementation, the compound represented by Chemical Formula 1 may be represented by, e.g., Chemical Formula 4, Chemical Formula 5, or Chemical Formula 6.

9

-continued

[Chemical Formula 5]

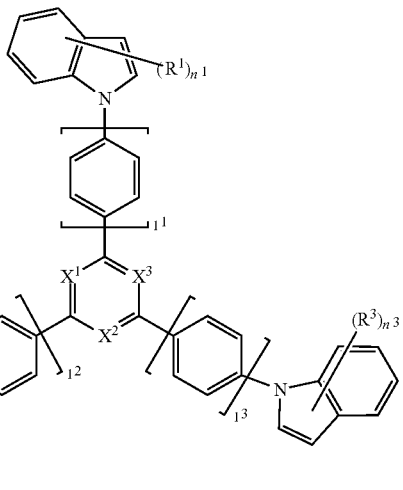

[Chemical Formula 6]

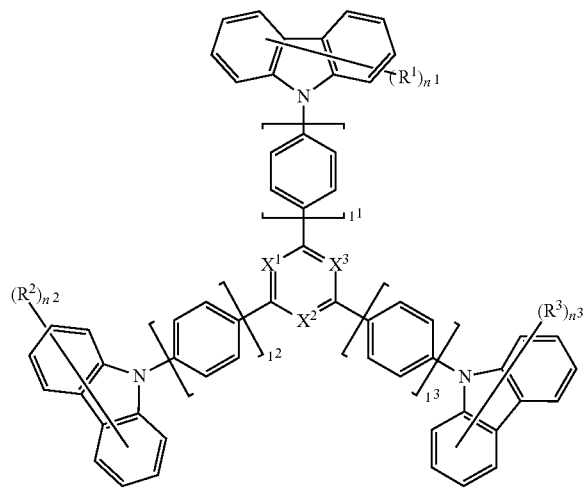

In Chemical Formulae 4 to 6, $X^1$ to $X^3$, $R^1$ to $R^3$, and $n^1$ to $n^3$ may each be defined the same as those described above.

$l^1$ to $l^3$ may each independently be, e.g., an integer of 0 to 4.

In an implementation, $l^1$ to $l^3$ may each independently be an integer of 0 to 2, e.g., 0 or 1.

In an implementation, $l^1$ to $l^3$ may be the same or different from each other. In an implementation, $l^1$ to $l^3$ may be the same.

Hereinafter, the compound represented by Chemical Formula 1 is also referred to as a first compound.

The polymer may further include a moiety derived from a second compound different from the first compound. In an implementation, the second compound may include, e.g., a carbonyl moiety, an ether moiety, or a combination thereof.

In an implementation, the polymer may include a structural unit obtained by reaction of a reaction mixture including the first compound; and the second compound different from the first compound. In an implementation, the second compound may include, e.g., an organic group including at least one oxygen atom.

The organic group including at least one oxygen atom may be an organic group including a carbonyl moiety, an ether moiety, or a combination thereof. In an implementation, the organic group including the carbonyl moiety may include, e.g., a ketone group, an aldehyde group, an ester group, an amide group, an acyl group, a carboxyl group, a urethane group, a carbonate group, or a combination thereof.

In an implementation, the organic group including the ether moiety may include, e.g., an alkyl group substituted with an alkoxy group, an alkenyloxy group, an alkynyloxy group, or a combination thereof.

In an implementation, the second compound may include an aldehyde group; an alkyl group substituted with an alkoxy group, an alkenyloxy group, an alkynyloxy group, or a combination thereof. In an implementation, the second compound may react with the first compound (or a third compound to be described below) to be bonded to form a secondary carbon, tertiary carbon, quaternary carbon, or a combination thereof. In an implementation, the second compound may be bonded to form a secondary carbon, a tertiary carbon, or a combination thereof. Herein, the secondary carbon is defined as a central carbon in which two of the four bonds are bonded to other carbons; the tertiary carbon is defined as a central carbon in which three of the four bonds are bonded to other carbons; and a quaternary carbon is defined as a central carbon in which all four bonds are bonded to other carbons.

In an implementation, by further increasing the solubility in solvents without deteriorating the excellent etch resistance of the polymer, the polymer may be prepared into a solution and effectively formed into a polymer layer by a solution process such as spin-on coating. In an implementation, the formed polymer layer may help reduce or prevent damage by etching gas exposed in a subsequent etching process due to its high etch resistance.

In an implementation, the second compound may include, e.g., an aldehyde group; or may include, e.g., at least two alkyl groups substituted with a substituted or unsubstituted C1 to C30 alkoxy group, a substituted or unsubstituted C2 to C30 alkenyloxy group, a substituted or unsubstituted C2 to C30 alkynyloxy group, or a combination thereof.

In an implementation, the second compound may include, e.g., one aldehyde group alone; or may include two alkyl groups substituted with a substituted or unsubstituted C1 to C30 alkoxy group, a substituted or unsubstituted C2 to C30 alkenyloxy group, a substituted or unsubstituted C2 to C30 alkynyloxy group, or a combination thereof.

In an implementation, the second compound may be represented by Chemical Formula 7 or Chemical Formula 8.

[Chemical Formula 7]

In Chemical Formula 7, A may be or may include, e.g., hydrogen, a substituted or unsubstituted C6 to C40 aromatic ring, a substituted or unsubstituted C2 to C30 heterocyclic group, or a combination thereof:

[Chemical Formula 8]

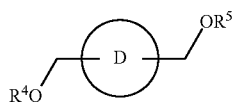

In Chemical Formula 8, D may be, e.g., a substituted or unsubstituted C6 to C40 aromatic ring.

$R^4$ and $R^5$ may each independently be or include, e.g., a substituted or unsubstituted C1 to C30 alkyl group, a substituted or unsubstituted C2 to C30 alkenyl group, a substituted or unsubstituted C2 to C30 alkynyl group, or a combination thereof.

The aromatic ring (e.g., the substituted or unsubstituted C6 to C40 aromatic ring) may be, e.g., a benzene ring; a fused ring in which two or more aromatic rings are fused; or a non-fused ring in which two or more aromatic rings are linked by a single bond, a C1 to C5 alkylene group, O, C(=O), or OC(=O).

The heterocyclic group (e.g., the substituted or unsubstituted C2 to C30 heterocyclic group) may be, e.g., a single ring containing at least one hetero atom; a fused ring in which at least one ring (of the two or more fused ring) includes at least one heteroatom. In an implementation, the ring including at least one heteroatom may be, e.g., a non-fused ring linked by a single bond, a C1 to C5 alkylene group, O, C(=O) or OC(=O).

The substituted or unsubstituted C1 to C30 alkyl group may be, e.g., a substituted or unsubstituted C1 to C20 alkyl group, a substituted or unsubstituted C1 to C15 alkyl group, a substituted or unsubstituted C1 to C10 alkyl group, a substituted or unsubstituted C1 to C6 alkyl group, a substituted or unsubstituted C1 to C4 alkyl group, or a combination thereof. In an implementation, the substituted or unsubstituted C1 to C30 alkyl group may be, e.g., a substituted or unsubstituted methyl group, a substituted or unsubstituted ethyl group, a substituted or unsubstituted propyl group, a substituted or unsubstituted butyl group, a substituted or unsubstituted pentyl group, a substituted or unsubstituted hexyl group, a substituted or unsubstituted heptyl group, a substituted or unsubstituted octyl group, a substituted or unsubstituted nonyl group, a substituted or unsubstituted decyl group, or a combination thereof.

The substituted or unsubstituted C2 to C20 alkenyl group may be, e.g., a substituted or unsubstituted C2 to C15 alkenyl group, a substituted or unsubstituted C2 to C10 alkenyl group, a substituted or unsubstituted C2 to C8 alkenyl group, or a combination thereof. In an implementation, the substituted or unsubstituted C2 to C20 alkenyl group may be, e.g., a substituted or unsubstituted ethenyl group, a substituted or unsubstituted propenyl group, a substituted or unsubstituted butenyl group, a substituted or unsubstituted pentenyl group, a substituted or unsubstituted hexenyl group, a substituted or unsubstituted heptenyl group, a substituted or unsubstituted octenyl group, a substituted or unsubstituted nonenyl group, a substituted or unsubstituted decenyl group, or a combination thereof.

The substituted or unsubstituted C2 to C20 alkynyl group may be, e.g., a substituted or unsubstituted C2 to C15 alkynyl group, a substituted or unsubstituted C2 to C10 alkynyl group, a substituted or unsubstituted C2 to C8 alkynyl group, or a combination thereof. In an implementation, the substituted or unsubstituted C2 to C20 alkynyl group may be, e.g., a substituted or unsubstituted ethynyl group, a substituted or unsubstituted propynyl group, a substituted or unsubstituted butynyl group, a substituted or unsubstituted pentynyl group, a substituted or unsubstituted hexynyl group, a substituted or unsubstituted heptynyl group, a substituted or unsubstituted octynyl group, a substituted or unsubstituted noninyl group, a substituted or unsubstituted decynyl group, or a combination thereof.

In an implementation, A may be a polycyclic ring. In an implementation, the polycyclic ring may be, e.g., a non-condensed ring, a condensed ring, or a combination thereof. In an implementation, higher etch resistance to etching gas of the layer made of the polymer may be provided.

In an implementation, A may be substituted or unsubstituted group of Group 2.

[Group2]

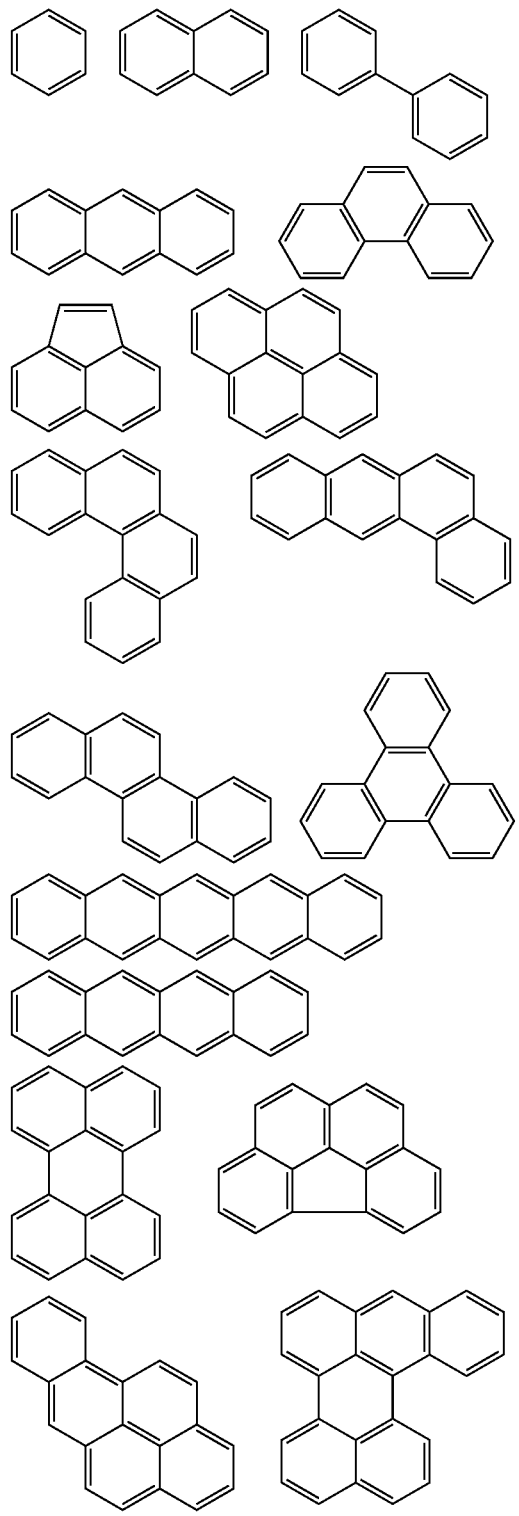

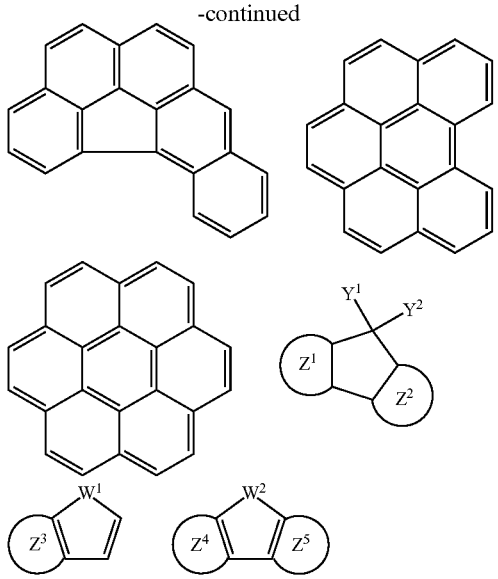

In Group 2, $Y^1$ and $Y^2$ may each independently be or include, e.g., hydrogen, a C6 to C30 aryl group, a C2 to C30 heterocyclic group, or a combination thereof.

$Z^1$ to $Z^5$ may each independently be or include, e.g., a C6 to C30 aromatic ring.

$W^1$ and $W^2$ may each independently be, e.g., $BR^b$, $NR^c$, O, S, $PR^d$, or $P(=O)R^e$. In an implementation, $R^b$ to $R^e$ may each independently be or include, e.g., hydrogen, a C1 to C30 alkyl group, a C2 to C30 alkenyl group, a C2 to C30 alkynyl group, a C1 to C30 heteroalkyl group, a C3 to C30 cycloalkyl group, a C3 to C30 cycloalkenyl group, a C6 to C30 aryl group, a C2 to C30 heterocyclic group, or a combination thereof.

In Group 2, each moiety may be unsubstituted or substituted with one or more substituents. In an implementation, the substituent may include, e.g., deuterium, a halogen, a hydroxy group, an amino group, a carboxyl group, a substituted or unsubstituted C1 to C30 alkoxy group, a substituted or unsubstituted C1 to C30 alkylamino group, a substituted or unsubstituted C1 to C30 alkyl group, a substituted or unsubstituted C2 to C30 alkenyl group, a substituted or unsubstituted C2 to C30 alkynyl group, a substituted or unsubstituted C1 to C30 heteroalkyl group, a substituted or unsubstituted C3 to C30 cycloalkyl group, a substituted or unsubstituted C2 to C30 heterocycloalkyl group, a substituted or unsubstituted C6 to C30 aryl group, a substituted or unsubstituted C2 to C30 heterocyclic group, or a combination thereof.

In an implementation, $Y^1$ and $Y^2$ may each independently be, e.g., hydrogen, a phenyl group, a naphthyl group, an anthracenyl group, a phenanthryl group, a naphthacenyl group, a pyrenyl group, a biphenyl group, a terphenyl group, a quaterphenyl group, a chrysenyl group, a triphenylenyl group, a perylenyl group, a combination thereof, or a combined fused ring of the foregoing groups.

In an implementation, $Y^1$ and $Y^2$ may be the same or different from each other.

In an implementation, $Z^1$ to $Z^5$ may each independently be, e.g., benzene, naphthalene, anthracene, phenanthrene, fluorene, fluoranthene, acenaphthylene, acenaphthene, benzophenanthrene, pyrene, triphenylene, chrysene, tetracene, benzofluoranthene, perylene, benzopyrene, naphthoanthracene, pentacene, benzoperylene, dibenzopyrene, coronene, or a combination thereof.

In an implementation, $Z^1$ to $Z^5$ may be the same or different from each other.

In an implementation, $Z^1$ and $Z^2$ may be the same or different from each other and $Z^4$ and $Z^5$ may be the same or different from each other.

In an implementation, $R^b$ to $R^e$ may each independently be, e.g., hydrogen or a C1 to C30 alkyl group, wherein the C1 to C30 alkyl group is the same as described above.

In an implementation, D may be substituted or unsubstituted group of Group 3. In the definition of Group 3, "substituted" means that it is further substituted with another substituent, and "unsubstituted" means that it is not further substituted with another substituent.

[Group 3]

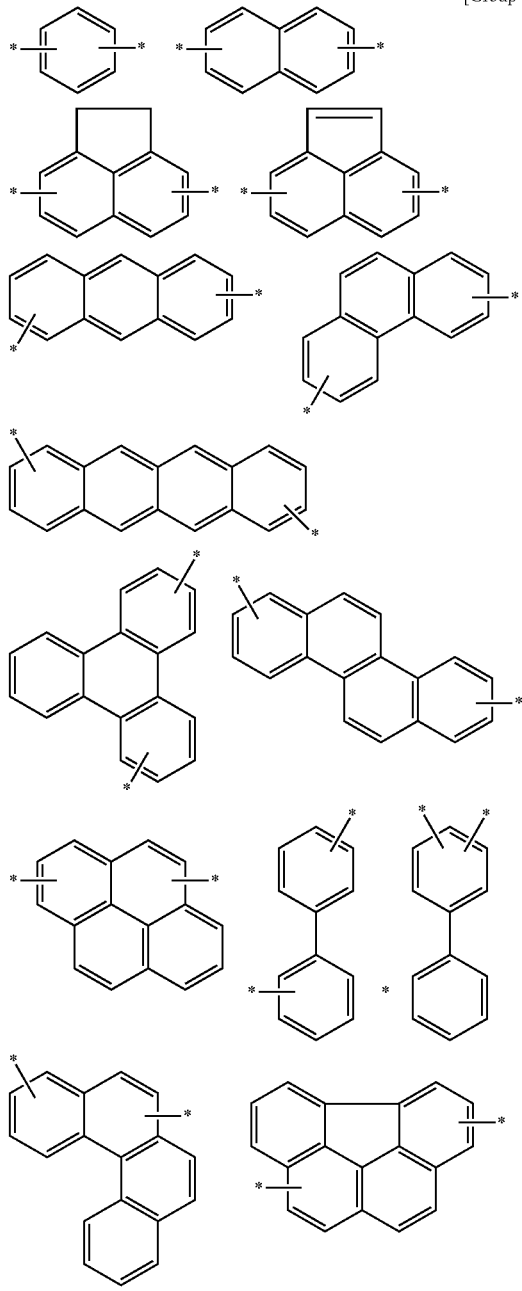

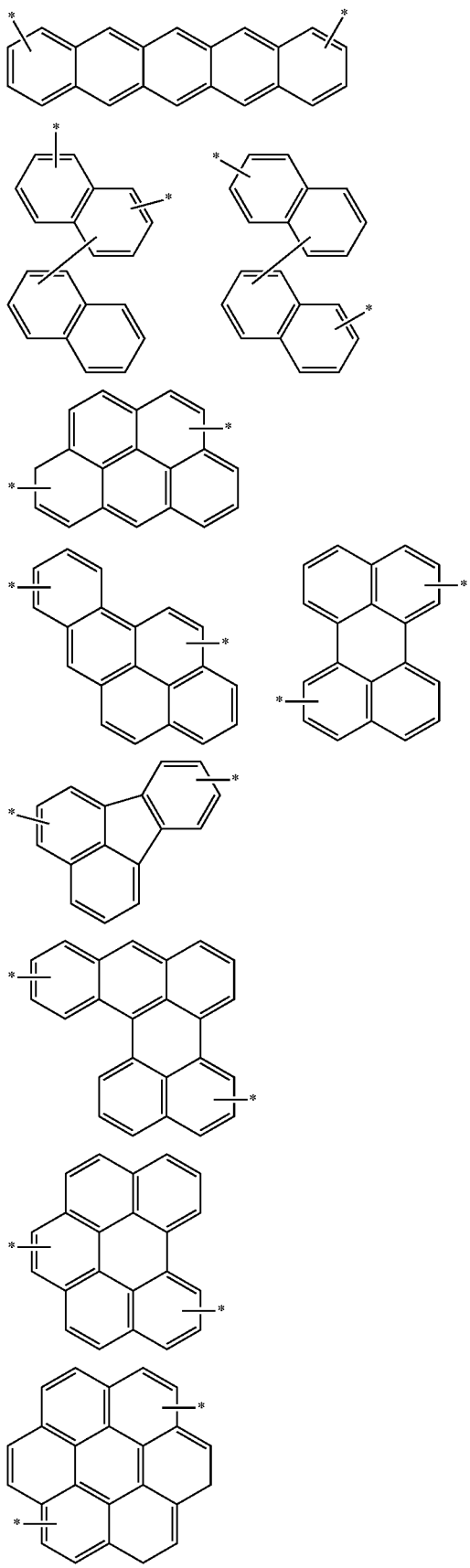

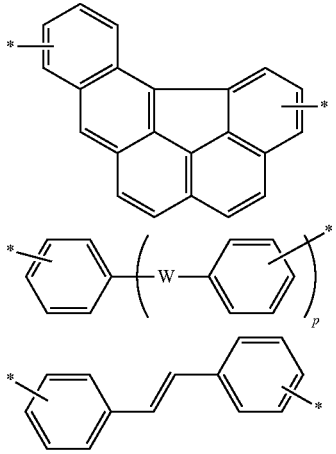

In Group 3, $R^a$ may be, e.g., a single bond, oxygen (—O—), sulfur (—S—), —SO$_2$—, a substituted or unsubstituted ethenylene, carbonyl(—C(=O)—), CR$^g$R$^h$, NR$^i$, or a combination thereof, wherein R$^g$ to R$^i$ are each independently hydrogen, a halogen, a carboxyl group, a substituted or unsubstituted C2 to C30 oxoalkyl group, a substituted or unsubstituted C1 to C30 alkoxycarbonyl group, a substituted or unsubstituted C1 to C30 alkoxy group, a substituted or unsubstituted C1 to C10 alkyl group, a substituted or unsubstituted C1 to C30 alkenyl group, a substituted or unsubstituted C1 to C30 alkynyl group, a substituted or unsubstituted C1 to C30 heteroalkyl group, a substituted or unsubstituted C3 to C30 cycloalkyl group, a substituted or unsubstituted C3 to C30 cycloalkenyl group, a substituted or unsubstituted C6 to C30 aryl group, a substituted or unsubstituted C3 to C30 heterocyclic group, or a combination thereof.

p may be, e.g., an integer of 1 to 30.

* is a linking point with other moieties in the compound represented by Chemical Formula 8.

In an implementation, p may be, e.g., an integer of 1 to 20, an integer of 1 to 10, an integer of 1 to 5, an integer of 1 to 3, or 1 or 2.

In an implementation, $R^4$ and $R^5$ may each independently be, e.g., a substituted or unsubstituted methyl group, a substituted or unsubstituted ethyl group, a substituted or unsubstituted propyl group, a substituted or unsubstituted butyl group, a substituted or unsubstituted pentyl group, a substituted or unsubstituted hexyl group, a substituted or unsubstituted ethenyl group, a substituted or unsubstituted propenyl group, a substituted or unsubstituted butenyl group, a substituted or unsubstituted pentenyl group, a substituted or unsubstituted hexenyl group, a substituted or unsubstituted ethynyl group, a substituted or unsubstituted propynyl group, a substituted or unsubstituted butynyl group, a substituted or unsubstituted pentynyl group, a substituted or unsubstituted hexynyl group, or a combination thereof.

Without wishing to be bound by a particular theory, the moiety derived from the aforementioned second compound may be represented by Chemical Formula 9.

[Chemical Formula 9]

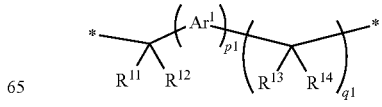

In Chemical Formula 9, $Ar^1$ may be, e.g., a divalent organic group including a substituted or unsubstituted C6 to C30 aromatic ring.

$R^{11}$ to $R^{14}$ may each independently be or include, e.g., hydrogen, deuterium, a halogen, a nitro group, an amino group, a hydroxy group, a substituted or unsubstituted C1 to C30 alkyl group, a substituted or unsubstituted C6 to C30 aryl group, or a combination thereof.

$R^{11}$ and $R^{12}$ may be independently present or may be linked to each other to form a ring.

$R^{13}$ and $R^{14}$ may be independently present or may be linked to each other to form a ring.

$p^1$ may be, e.g., 0 or 1, $q^1$ may be, e.g., an integer of 0 to 3.

* is a linking point with other moieties in the polymer.

In an implementation, in the definition of $Ar^1$, the aromatic ring may be a benzene ring; a fused ring in which two or more aromatic rings are fused; or a non-fused ring in which two or more aromatic rings are linked by a single bond, a C1 to C5 alkylene group, O, C(=O), or OC(=O).

In an implementation, $Ar^1$ may be, e.g., a substituted or unsubstituted group of Group 3.

In an implementation, at least two of $R^{11}$ to $R^{14}$ may be hydrogen, a substituted or unsubstituted C6 to C30 aryl group, or a combination thereof; e.g., at least one of $R^{11}$ and $R^{12}$ may be hydrogen, a substituted or unsubstituted C6 to C30 aryl group, or a combination thereof, and at least one of $R^{13}$ and $R^{14}$ may be hydrogen, a substituted or unsubstituted C6 to C30 aryl group, or a combination thereof. In an implementation, $R^{11}$ to $R^{14}$ may each independently be hydrogen, a substituted or unsubstituted C6 to C30 aryl group, or a combination thereof. Herein, the substituted or unsubstituted C6 to C30 aryl group is the same as described above.

In an implementation, at least two of $R^{11}$ to $R^{14}$ may be hydrogen; or e.g., at least one of $R^{11}$ and $R^{12}$ may be hydrogen, and at least one of $R^{13}$ and $R^{14}$ may be hydrogen. In an implementation, all of $R^{11}$ to $R^{14}$ may be hydrogen.

In an implementation, two of $R^{11}$ to $R^{14}$ may be hydrogen, and the other two of $R^{11}$ to $R^{14}$ may be a substituted or unsubstituted C6 to C30 aryl group; e.g., one of $R^{11}$ and $R^{12}$ may be hydrogen and the other of $R^{11}$ and $R^{12}$ may be a substituted or unsubstituted C6 to C30 aryl group, and one of $R^{13}$ and $R^{14}$ may be hydrogen and the other of $R^{13}$ and $R^{14}$ may be substituted or unsubstituted C6 to C30 aryl group. Herein, the substituted or unsubstituted C6 to C30 aryl group is the same as described above.

In an implementation, at least two of $R^{11}$ to $R^{14}$ may be a substituted or unsubstituted C6 to C30 aryl group, e.g., at least one of $R^{11}$ and $R^{12}$ may be a substituted or unsubstituted C6 to C30 aryl group, and at least one of $R^{13}$ and $R^{14}$ may be a substituted or unsubstituted C6 to C30 aryl group. In an implementation, all of $R^{11}$ to $R^{14}$ may be a substituted or unsubstituted C6 to C30 aryl group. Herein, the substituted or unsubstituted C6 to C30 aryl group is the same as described above.

In an implementation, $R^{11}$ to $R^{14}$ may be the same or different from each other, e.g., $R^{11}$ and $R^{12}$ may be the same or different from each other, and $R^{13}$ and $R^{14}$ may be the same or different from each other.

In an implementation, $R^{11}$ and $R^{12}$ may each independently exist or may be combined with each other to form a ring, and $R^{13}$ and $R^{14}$ may each independently be present or may be combined with each other to form a ring.

In an implementation, $q^1$ may be an integer of 0 to 2, and $q^1$ may be 0 or 1.

When $q^1$ is an integer of 2 or more, a plurality of $R^{13}$'s may be the same or different from each other, and a plurality of $R^{14}$'s may be the same or different from each other.

In an implementation, both $q^1$ and $p^1$ may be 0, and both $q^1$ and $p^1$ may be 1.

In an implementation, Chemical Formula 9 may be represented by Chemical Formula 9-1 or Chemical Formula 9-2.

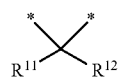

[Chemical Formula 9-1]

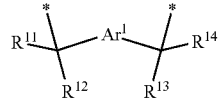

[Chemical Formula 9-2]

In Chemical Formulae 9-1 and 9-2, $Ar^1$, $R^{11}$ to $R^{14}$, and * may be defined the same as those described above.

In an implementation, Chemical Formula 9 may be, e.g., a substituted or unsubstituted group of Group A.

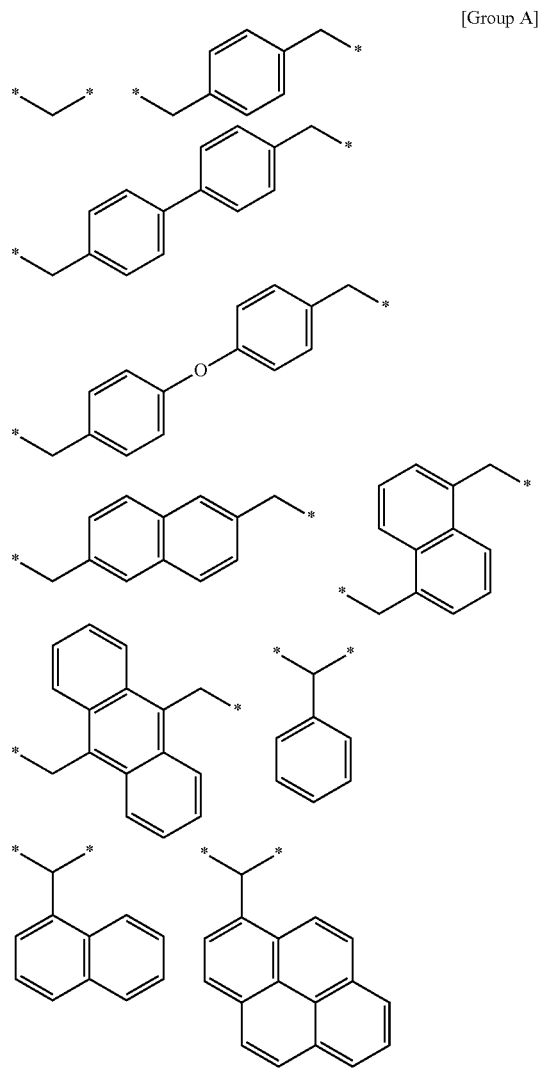

[Group A]

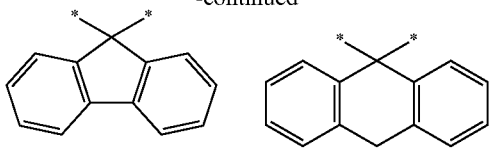

In the definition of Group A, "substituted" means that it is further substituted with another substituent, and "unsubstituted" means that it is not further substituted with another substituent.

The aforementioned polymer may further include a moiety derived from a third compound that is different from the first compound and the second compound. The third compound may include, e.g., a substituted or unsubstituted C6 to C40 aromatic ring, a substituted or unsubstituted C2 to C30 heterocyclic group, or a combination thereof. In an implementation, the carbon content of the polymer may be further increased to form a hard polymer layer, thereby providing higher etch resistance.

In an implementation, the aforementioned reaction mixture may further include the third compound that is different from the aforementioned first compound and second compound, and that includes a substituted or unsubstituted C6 to C40 aromatic ring, a substituted or unsubstituted C2 to C30 heterocyclic group, or a combination thereof. The C6 to C40 aromatic ring and a substituted or unsubstituted C2 to C30 heterocyclic group may be each the same as those described above.

In an implementation, the third compound may include a polycyclic ring, and the polycyclic ring may be a non-condensed ring, a condensed ring, or a combination thereof. Accordingly, higher etch resistance to the etching gas of the layer made of the polymer may be imparted.

In an implementation, the third compound may include a substituted or unsubstituted naphthalene, a substituted or unsubstituted biphenyl, a substituted or unsubstituted anthracene, a substituted or unsubstituted phenanthrene, a substituted or unsubstituted benzoanthracene, a substituted or unsubstituted fluoranthene, a substituted or unsubstituted acenaphthylene, a substituted or unsubstituted acenaphthene, a substituted or unsubstituted benzophenanthrene, a substituted or unsubstituted pyrene, a substituted or unsubstituted triphenylene, a substituted or unsubstituted chrysene, a substituted or unsubstituted tetracene, a substituted or unsubstituted benzofluoranthene, a substituted or unsubstituted perylene, a substituted or unsubstituted benzopyrene, a substituted or unsubstituted naphthoanthracene, a substituted or unsubstituted pentacene, a substituted or unsubstituted benzoperylene, a substituted or unsubstituted dibenzopyrene, a substituted or unsubstituted dibenzoperylene, a substituted or unsubstituted coronene, a substituted or unsubstituted diphenylfluorene, a substituted or unsubstituted dinaphthylfluorene, a substituted or unsubstituted pyrrole, a substituted or unsubstituted imidazole, a substituted or unsubstituted indole, a substituted or unsubstituted carbazole, a substituted or unsubstituted benzimidazole or a combination thereof.

In an implementation, the third compound may include a C6 to C40 aromatic ring that is unsubstituted or substituted with a hydroxyl group, an amine group, a substituted or unsubstituted C1 to C30 alkoxy group, or a combination thereof; or a C2 to C30 heterocyclic group that is unsubstituted or substituted with a hydroxyl group, an amine group, a substituted or unsubstituted C1 to C30 alkoxy group, or a combination thereof.

In an implementation, the third compound may include a C6 to C30 aromatic ring that is unsubstituted or substituted with a hydroxyl group, an amine group, a substituted or unsubstituted C1 to C30 alkoxy group, or a combination thereof alone; or may include a C2 to C30 heterocyclic group that is unsubstituted or substituted with a hydroxyl group, an amine group, a substituted or unsubstituted C1 to C30 alkoxy group, or a combination thereof alone.

Accordingly, the composition according to an embodiment may be effectively applied to a solution process such as spin coating by increasing solubility in a solvent, and a hard polymer layer may be formed by increasing the carbon content, thereby providing high etch resistance.

In an implementation, at least one of the first compound, the second compound, and the third compound may include a condensed ring; e.g., at least one of the second compound and the third compound may include a condensed ring; both of the second compound and the third compound may include a condensed ring; or all of the first compound, the second compound, and the third compound may include a condensed ring.

In an implementation, the first compound may be included in an amount of about 5 mol % to 50 mol %, e.g., about 10 mol % to 45 mol %, or about 20 mol % to 40 mol %, based on the total number of moles of the first compound, the second compound, and the third compound in a mixture to form the polymer.

In an implementation, the second compound may be included in an amount of about 20 mol % to about 90 mol %, e.g., about 30 mol % to about 85 mol %, or about 40 mol % to 75 mol %, based on the total number of moles of the first compound, the second compound, and the third compound in a mixture to form the polymer.

In an implementation, the third compound may be included in an amount of about 5 mol % to about 50 mol %, e.g., about 10 mol % to about 40 mol %, or about 15 mol % to about 30 mol %, based on the total number of moles of the first compound, the second compound, and the third compound in a mixture to form the polymer.

The polymer may be synthesized through a condensation reaction using the first compound, the second compound, and the third compound as reactants. In an implementation, the polymer may be synthesized by first condensing the first compound and the second compound, and then performing a condensation reaction of the third compound. In an implementation, the first compound and the second compound may be first subjected to a condensation reaction and then alternately performing a condensation reaction the third compound and the second compound.

The polymer may include one or a plurality of the aforementioned structural units, and each of the plurality of the aforementioned structural units may have the same structure or different structures, and the number and arrangement of the aforementioned structural units included in the polymer are not limited.

In the polymer according to an embodiment, a plurality of moieties derived from the aforementioned first compound may be included, a plurality of moieties derived from the aforementioned second compound may be included, and a plurality of moieties derived from the aforementioned third compound may be included. In the aforementioned polymer, the plurality of moieties derived from the aforementioned first compound may be the same or different from each other, the plurality of moieties derived from the aforementioned second compound may be the same or different from each other, and the plurality of moieties derived from the aforementioned third compound may be the same or different from each other.

The polymer may further include one or two or more structural units different from the aforementioned structural units.

The polymer may have a weight average molecular weight of, e.g., about 500 to about 200,000 g/mol. In an implementation, the polymer may have a weight average molecular weight of about 700 to about 100,000 g/mol, about 800 to about 50,000 g/mol or about 900 to about 10,000 g/mol. When the polymer has a weight average molecular weight within the ranges, the polymer may be optimized by adjusting the amount of carbon and solubility in a solvent.

In an implementation, the solvent used in the hardmask composition may be a suitable solvent having sufficient dissolubility or dispersibility with respect to the polymer. In an implementation, the solvent may include, e.g., propylene glycol, propylene glycol diacetate, methoxy propanediol, diethylene glycol, diethylene glycol butyl ether, tri(ethylene glycol)monomethyl ether, propylene glycol monomethyl ether, propylene glycol monomethyl ether acetate, cyclohexanone, ethyl lactate, gamma-butyrolactone, N,N-dimethyl formamide, N,N-dimethyl acetamide, methylpyrrolidone, methylpyrrolidinone, acetylacetone, or ethyl 3-ethoxypropionate.

The polymer may be included in an amount of, e.g., about 0.1 wt % to about 60 wt %, about 0.5 wt % to about 50 wt %, about 1 wt % to about 35 wt %, or about 23 wt % to 30 wt %, based on a total weight of the hardmask composition. When the polymer is included within the ranges, a thickness, surface roughness and planarization of the hardmask may be controlled.

In an implementation, the hardmask composition may further include an additive, e.g., a surfactant, a crosslinking agent, a thermal acid generator, or a plasticizer.

The surfactant may include, e.g., a fluoroalkyl-based compound, an alkylbenzene sulfonate salt, an alkyl pyridinium salt, polyethylene glycol, or a quaternary ammonium salt.

The crosslinking agent may include, e.g., a melamine-based, substituted urea-based, or a polymer-based crosslinking agent. In an implementation, it may be a crosslinking agent having at least two crosslinking forming substituents, e.g., a compound such as methoxymethylated glycoluril, butoxymethylated glycoluril, methoxymethylated melamine, butoxymethylated melamine, methoxymethylated benzoguanamine, butoxymethylated benzoguanamine, methoxymethylatedurea, butoxymethylatedurea, methoxymethylated thiourea, butoxymethylated thiourea, or the like.

The crosslinking agent may be a crosslinking agent having high heat resistance. The crosslinking agent having high heat resistance may be a compound including a crosslinking substituent including an aromatic ring (e.g., a benzene ring, or a naphthalene ring) in the molecule.

The thermal acid generator may include, e.g., an acidic compound such as p-toluene sulfonic acid, trifluoromethane sulfonic acid, pyridiniump-toluenesulfonic acid, salicylic acid, sulfosalicylic acid, citric acid, benzoic acid, hydroxybenzoic acid, naphthalenecarbonic acid, and the like or/and 2,4,4,6-tetrabromocyclohexadienone, benzointosylate, 2-nitrobenzyltosylate, other organosulfonic acid alkylester, or the like.

The additive may be included in an amount of, e.g., about 0.001 to 40 parts by weight, about 0.01 to 30 parts by weight, or about 0.1 to 20 parts by weight, based on 100 parts by weight of the hardmask composition. Within the ranges, solubility may be improved while optical properties of the hardmask composition are not changed.

According to another embodiment, an organic film produced using the hardmask composition is provided. The organic film may be, e.g., formed by coating the hardmask composition on a substrate and heat-treating it for curing and may include, for example, a hardmask layer, a planarization layer, a sacrificial layer, a filler, and the like for an electronic device.

Hereinafter, a method of forming patterns using the aforementioned hardmask composition is described.

A method of forming patterns according to an embodiment may include forming a material layer on a substrate, applying a hardmask composition including the aforementioned polymer and solvent on the material layer, heat-treating the hardmask composition to form a hardmask layer, forming a photoresist layer on the hardmask layer, exposing and developing the photoresist layer to form a photoresist pattern, selectively removing the hardmask layer using the photoresist pattern to expose a portion of the material layer, and etching the exposed portion of the material layer.

The substrate may be, e.g., a silicon wafer, a glass substrate, or a polymer substrate.

The material layer is a material to be finally patterned, e.g., a metal layer such as an aluminum layer and a copper layer, a semiconductor layer such as a silicon layer, or an insulation layer such as a silicon oxide layer and a silicon nitride layer. The material layer may be formed through a method such as a chemical vapor deposition (CVD) process.

The hardmask composition is the same as described above and may be applied by spin-on coating in a form of a solution. In an implementation, a thickness of the hardmask composition may be, e.g., about 50 Å to about 200,000 Å.

The heat-treating of the hardmask composition may be performed, e.g., at about 100° C. to about 1000° C. for about 10 seconds to about 1 hour.

In an implementation, the heat-treating of the hardmask composition may include one heat treatment or a plurality of heat treatments.

In an implementation, the heat-treating of the hardmask composition may be, e.g., performed at about 100° C. to about 1,000° C. for about 10 seconds to about 1 hour, e.g., the heat treatment may be performed under an atmosphere of air, or nitrogen, or oxygen at a concentration of about 1 wt % or less.

In an implementation, the heat-treating of the hardmask composition may consecutively include, e.g., a primary heat treatment performed at about 100° C. to about 1,000° C. for about 10 seconds to about 1 hour and, e.g., a secondary heat treatment performed at about 100° C. to about 1,000° C. for about 10 seconds to about 1 hour. In an implementation, the primary and secondary heat treatments may be performed under an atmosphere of air, or nitrogen, or oxygen at a concentration of about 1 wt % or less.

In an implementation, the forming of the hardmask layer may include UV/Vis curing and/or near IR curing.

In an implementation, the forming of the hardmask layer may include at least one or two or more successively selected from the primary heat treatment, the secondary heat treatment, the UV/Vis curing, and the near IR curing.

In an implementation, the method may further include forming a silicon-containing thin layer on the hardmask layer. The silicon-containing thin layer may be formed of, e.g., SiCN, SiOC, SiON, SiOCN, SiC, SiO, SiN, or the like.

In an implementation, the method may further include forming a bottom antireflective coating (BARC) on the upper surface of the silicon-containing thin layer or on the upper surface of the hardmask layer before forming the photoresist layer.

Exposure of the photoresist layer may be performed by using, e.g., ArF, KrF, or EUV. After exposure, heat-treating may be performed at about 100° C. to about 700° C.

The etching process of the exposed portion of the material layer may be performed through a dry etching process using an etching gas, and the etching gas may be, e.g., $CHF_3$, $CF_4$, $Cl_2$, $BCl_3$, or a mixed gas thereof.

The etched material layer may be formed in a plurality of patterns, and the plurality of patterns may be a metal pattern, a semiconductor pattern, an insulation pattern, and the like, e.g., diverse patterns of a semiconductor integrated circuit device.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Synthesis of Polymers

Synthesis Example 1: Synthesis of Polymer 1

Tricarbazolyl benzene represented by Chemical Formula 1a (17.21 g, 0.03 mol), pyrene carboxaldehyde represented by Chemical Formula 7a (11.51 g, 0.05 mol), para-toluene sulfonic acid monohydrate (p-toluenesulfonic acid monohydrate, 7.61 g, 0.04 mol), and 1,4-dioxane (36.33 g) were put into a 500 ml flask, and stirred at 110° C. to react. A sample was taken from the polymerization reactant every hour, and measured with respect to a weight average molecular weight. When the weight average molecular weight reached 4,200 to 4,500 g/mol, the reaction was quenched. Upon completion of the polymerization reaction, tetrahydrofuran (10 g), ethyl acetate (70 g), and distilled water (110 g) were added thereto to remove an acid catalyst, which was repeated three times. Subsequently, ethyl acetate (50 g) was added thereto to extract an organic layer, and treated under a reduced pressure. Subsequently, tetrahydrofuran (50 g) was added thereto, and the mixture was added to hexane (300 g) for precipitation. Then, it was filtered and dried to remove 1,4-dioxane and the remaining monomers, obtaining Polymer 1 (Mw: 4,800 g/mol).

[Chemical Formula 1a]

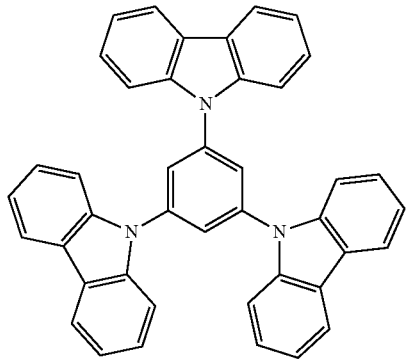

[Chemical Formula 7a]

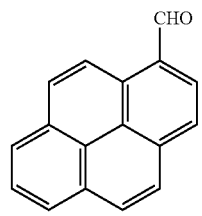

Synthesis Example 2: Synthesis of Polymer 2

Tricarbazolyl benzene represented by Chemical Formula 1a (11.47 g, 0.02 mol), pyrene carboxaldehyde represented by Chemical Formula 7a (11.51 g, 0.05 mol), 1-hydroxypyrene (4.37 g, 0.02 mol), para-toluene sulfonic acid monohydrate (7.61 g, 0.04 mol), and 1,4-dioxane (34.96 g) were put into a 500 ml flask, and stirred at 110° C. to react. A sample was taken from the polymerization reactant every hour, and measured with respect to a weight average molecular weight. When the weight average molecular weight reached 3,100 to 3,300 g/mol, the reaction was quenched. Upon completion of the polymerization reaction, tetrahydrofuran (10 g), ethyl acetate (70 g), and distilled water (110 g) were added thereto to remove an acid catalyst, which was repeated three times. Subsequently, ethyl acetate (50 g) was added thereto to extract an organic layer, and treated under a reduced pressure. Then, tetrahydrofuran (50 g) was added thereto, and the mixture was added to hexane (300 g) for precipitation, and then, filtered and dried to remove 1,4-dioxane and the remaining monomers, obtaining Polymer 2 (Mw: 3,700 g/mol).

Synthesis Example 3: Synthesis of Polymer 3

Triindolyl benzene represented by Chemical Formula 1b (12.71 g, 0.03 mol), pyrene carboxaldehyde represented by Chemical Formula 7a (11.51 g, 0.05 mol), para-toluene sulfonic acid monohydrate (7.61 g, 0.04 mol), and 1,4-dioxane (31.83 g) were put into a 500 ml flask, and stirred at 110° C. to react. A sample was taken from the polymerization reactant every hour, and measured with respect to a weight average molecular weight. When the weight average molecular weight reached 3,800 to 4,100 g/mol, the reaction was quenched. Upon completion of the polymerization reaction, tetrahydrofuran (10 g), ethyl acetate (70 g), and distilled water (110 g) were added thereto to remove an acid catalyst, which was repeated three times. Subsequently, ethyl acetate (50 g) was added thereto to extract an organic layer, and treated under a reduced pressure. Then, tetrahydrofuran (50 g) was added thereto, and the mixture was added to hexane (300 g) for precipitation, and then, filtered and dried to remove 1,4-dioxane and the remaining monomers, obtaining Polymer 3. (Mw: 4,400 g/mol)

[Chemical Formula 1b]

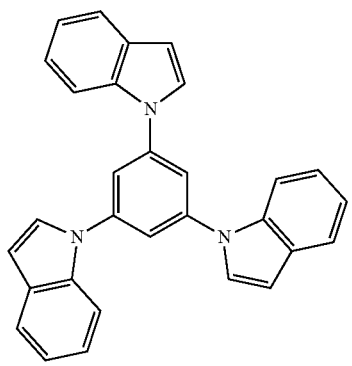

Synthesis Example 4: Synthesis of Polymer 4

Tricarbazolyl benzene (6.88 g, 0.012 mol), triindolyl benzene represented by Chemical Formula 1b (5.08 g, 0.012 mol), pyrene carboxaldehyde represented by Chemical Formula 7a (9.21 g, 0.040 mol), para-toluene sulfonic acid monohydrate (6.09 g, 0.032 mol), and 1,4-dioxane (27.26 g) were put into a 500 mL flask, and stirred at 110° C. to react. A sample was taken from the polymerization reactant every hour, and measured with respect to a weight average molecular weight. Upon completion of the polymerization reaction, tetrahydrofuran (10 g), ethyl acetate (70 g), and distilled water (110 g) were added thereto to remove an acid catalyst, which was repeated three times. Subsequently, ethyl acetate (50 g) was added thereto to extract an organic layer, and treated under a reduced pressure. Then, tetrahydrofuran (50 g) was added thereto, and the mixture was added to hexane (300 g) for precipitation and then, filtered, and dried to remove 1,4-dioxane and the remaining monomers, obtaining Polymer 4 (Mw: 4,600 g/mol).

Synthesis Example 5: Synthesis of Polymer 5

Tricarbazolyl benzene represented by Chemical Formula 1a (17.21 g, 0.03 mol), 2,5-dimethoxy-p-xylene represented by Chemical Formula 8a (9.97 g, 0.06 mol), para-toluene sulfonic acid monohydrate (0.57 g, 3.0 mmol), and propylene glycolmonomethylether acetic acid (27.75 g) were put into a 500 mL flask, and stirred at 110° C. to react. A sample was taken from the polymerization reactant every hour, and measured with respect to a weight average molecular weight. When the weight average molecular weight reached 2,800 to 3,000 g/mol, the reaction was quenched. Upon completion of the polymerization reaction, tetrahydrofuran (10 g), ethyl acetate (70 g), and distilled water (110 g) were added thereto to remove an acid catalyst, which was repeated three times. Subsequently, ethyl acetate (50 g) was added thereto to extract an organic layer, and treated under a reduced pressure. Then, tetrahydrofuran (50 g) was added thereto, and the mixture was added to hexane (300 g) for precipitation, and then, filtered and dried to remove propylene glycolmonomethylether acetic acid and the remaining monomers, obtaining Polymer 5 (Mw: 3,400 g/mol).

[Chemical Formula 8a]

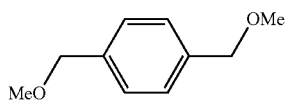

Synthesis Example 6: Synthesis of Polymer 6

Tricarbazolyl benzene represented by Chemical Formula 1a (17.21 g, 0.03 mol), paraformaldehyde (1.80 g, 0.06 mol), para-toluene sulfonic acid monohydrate (0.06 g, 0.3 mmol), and propylene glycol monomethyl ether acetic acid (44.50 g) were put into a 500 mL flask, and stirred at 65° C. to react. A sample was taken from the polymerization reactant every hour, and measured with respect to a weight average molecular weight. When the weight average molecular weight reached 2,700 to 2,900 g/mol, the reaction was quenched. Upon completion of the polymerization reaction, tetrahydrofuran (10 g), ethyl acetate (70 g), and distilled water (110 g) were added thereto to remove an acid catalyst, which was repeated three times. Subsequently, ethyl acetate (50 g) was added thereto to extract an organic layer, and treated under a reduced pressure. Then, tetrahydrofuran (50 g) was added thereto, and the mixture was added to hexane (300 g) for precipitation, and then, filtered and dried to remove propylene glycol monomethyl ether acetic acid and the remaining monomers, obtaining Polymer 6 (Mw: 3,300 g/mol).

Comparative Synthesis Example 1: Synthesis of Polymer A 1-hydroxypyrene (10.91 g, 0.05 mol), anthracene-9-carboxaldehyde (10.31 g, 0.05 mol), para-toluene sulfonic acid monohydrate (7.61 g, 0.04 mol), and 1,4-dioxane (28.80 g) were put into a 500 mL flask, and stirred at 110° C. to react. A sample was taken from the polymerization reactant every hour, and measured with respect to a weight average molecular weight. When the weight average molecular weight reached 2,700 to 2,900 g/mol, the reaction was quenched. Upon completion of the polymerization reaction, tetrahydrofuran (10 g), ethyl acetate (70 g), and distilled water (110 g) were added thereto to remove an acid catalyst, which was repeated three times. Subsequently, ethyl acetate (50 g) was added thereto to extract an organic layer, and treated under a reduced pressure. Then, tetrahydrofuran (50 g) was added thereto, and the mixture was added to hexane (300 g) for precipitation, and then, filtered and dried to remove 1,4-dioxane and the remaining monomers, obtaining Polymer A including a structural unit represented by Chemical Formula A (Mw: 3,200 g/mol).

[Chemical Formula A]

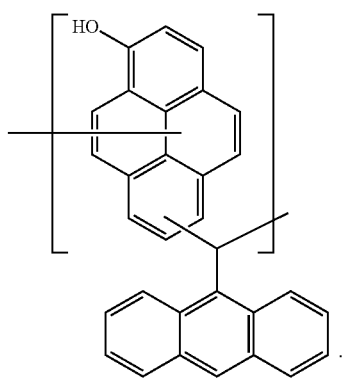

Comparative Synthesis Example 2: Synthesis of Polymer B 1-hydroxypyrene (10.91 g, 0.05 mol), 2,5-dimethoxy-p-xylene (8.31 g, 0.05 mol), para-toluene sulfonic acid monohydrate (0.95 g, 0.005 mol), and propylene glycol monomethyl ether acetic acid (20.18 g) were put into a 500 mL flask, and stirred at 110° C. to react. A sample was taken from the polymerization reactant every hour, and measured with respect to a weight average molecular weight. When the weight average molecular weight reached 2,600 to 2,800 g/mol, the reaction was quenched. Upon completion of the polymerization reaction, tetrahydrofuran (10 g), ethyl acetate (70 g), and distilled water (110 g) were added thereto to remove an acid catalyst, which was repeated three times. Subsequently, ethyl acetate (50 g) was added thereto to extract an organic layer, and treated under a reduced pressure. Then, tetrahydrofuran (50 g) was added thereto, and the mixture was added to hexane (300 g) for precipitation, and then, filtered and dried to remove propylene glycol monomethyl ether acetic acid and the remaining monomers, obtaining Polymer B including a structural unit represented by Chemical Formula B (Mw: 3,100 g/mol).

[Chemical Formula B]

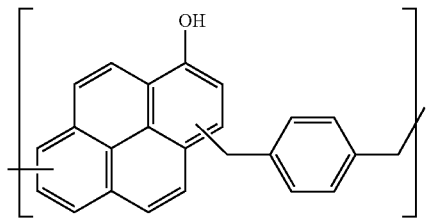

Comparative Synthesis Example 3: Synthesis of Polymer C 9-phenylcarbazole (12.17 g, 0.05 mol), pyrene carboxaldehyde represented by Chemical Formula 7a (11.51 g, 0.05 mol), para-toluene sulfonic acid monohydrate (7.61 g, 0.04 mol), and 1,4-dioxane (31.29 g) were put into a 500 mL flask, and stirred at 110° C. to react. A sample was taken from the polymerization reactant every hour, and measured with respect to a weight average molecular weight. When the weight average molecular weight reached 2,800 to 3,000 g/mol, the reaction was quenched. Upon completion of the polymerization reaction, tetrahydrofuran (10 g), ethyl acetate (70 g), and distilled water (110 g) were added thereto to remove an acid catalyst, which was repeated three times. Subsequently, ethyl acetate (50 g) was added thereto to extract an organic layer, and treated under a reduced pressure. Then, tetrahydrofuran (50 g) was added thereto, and the mixture was added to hexane (300 g) for precipitation, and then, filtered and dried to remove propylene glycol monomethyl ether acetic acid and the remaining monomers, obtaining Polymer C including a structural unit represented by Chemical Formula C (Mw: 3,300 g/mol).

[Chemical Formula C]

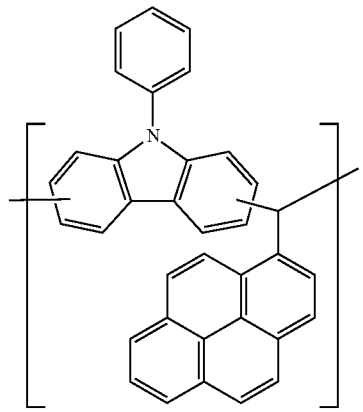

Preparation of Hardmask Compositions 1.4 g of each of Polymers 1 to 6 and A to C according to Synthesis Examples 1 to 6 and Comparative Synthesis Examples 1 to 3 were respectively taken and dissolved in 10 g of a mixed solvent of propylene glycol monomethyl ether acetate and cyclohexanone in a volume ratio of 7:3, and filtered with a 0.1 μm TEFLON (tetrafluoroethylene) filter, preparing hardmask compositions according to Examples 1 to 6 and Comparative Examples 1 to 3.

Evaluation 1: Solubility

The hardmask compositions according to Examples 1 to 6 and Comparative Examples 1 to 3 were stirred at 50° C. for 1 hour, and whether or not each composition was dissolved in the heated state of 50° C. was checked. Subsequently, the hardmask compositions were cooled down to 25° C., and whether or not each polymer was dissolved at 25° C. was checked. Subsequently, the hardmask compositions were respectively stirred at 25° C. for 6 hours and allowed to stand at 25° C., and then, whether or not each polymer was dissolved was checked.

The results are shown in Table 1.

TABLE 1

| | Solubility |
|---|---|
| Example 1 | ⊚ |
| Example 2 | ⊚ |
| Example 3 | ⊚ |
| Example 4 | ○ |
| Example 5 | ⊚ |
| Example 6 | ○ |
| Comparative Example 1 | Δ |
| Comparative Example 2 | ○ |
| Comparative Example 3 | Δ |

⊚: Undissolved polymer was not visually observed at 25° C.

○: Undissolved polymer was not visually confirmed at 25° C., but a small amount of the undissolved polymer was visual after being left at 25° C.

Δ: Undissolved polymer was not visually confirmed in the heated state of 50° C., but after being left at 25° C., visually confirmed.

X: Undissolved polymer was visually confirmed in the heated state of 50° C.

Referring to Table 1, Polymers 1 to 6 according to Synthesis Examples 1 to 6 exhibited improved solubility, compared with Comparative Polymers A to C according to Comparative Synthesis Examples 1 to 3.

Evaluation 2. Evaluation of Etch Resistance

The hardmask compositions according to Examples 1 to 6 and Comparative Examples 1 to 3 were respectively coated on a silicon wafer, and heat-treated on a hot plate at about 400° C. for 2 minutes to form about 4,000 Å-thick organic films. Then, the organic films were dry-etched for 100 seconds by using $CF_x$ gas, and then the thickness of each organic film was measured again by FE-SEM (K-MAC).

Thickness differences of the organic films before and after the dry etching and etch time were used to calculate bulk etch rates (BER) according to Calculation Equation 1.

Etch rate (Å/s)=(thickness of initial organic film−thickness of organic film after etching)/etch time     [Calculation Equation 1]

The results are shown in Table 2.

TABLE 2

|  | Bulk etch rate (Å/s) |
| --- | --- |
| Example 1 | ⊚ |
| Example 2 | ⊚ |
| Example 3 | ⊚ |
| Example 4 | ⊚ |
| Example 5 | ○ |
| Example 6 | ○ |
| Comparative Example 1 | ○ |
| Comparative Example 2 | △ |
| Comparative Example 3 | ○ |

⊚: Etch rate of less than 10 Å/s
○: Etch rate of 10 Å/s or more and less than 11 Å/s
△: Etch rate of 11 Å/s or more and less than 12 Å/s
X: Etch rate of 12 Å/s or more Referring to Table 2, organic films respectively formed of the hardmask compositions according to Examples 1 to 6 exhibited sufficient etch resistance against etching gas and thus improved etch resistance, compared with organic films respectively formed of the hardmask compositions according to Comparative Examples 1 to 3.

By way of summation and review, when a pattern needs to be formed in a smaller size, it may not be easy to provide a fine pattern having an excellent profile by using other lithographic techniques. Accordingly, an auxiliary layer, called a hardmask layer, may be formed between the material layer and the photoresist layer to help provide a fine pattern.

One or more embodiments may provide a hardmask composition including a polymer that may be effectively applied to a hardmask layer.

A solubility of the polymer and etch resistance of the hardmask layer may be simultaneously secured.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A hardmask composition, comprising:
a polymer including a moiety derived from a compound represented by Chemical Formula 2; and
a solvent,

[Chemical Formula 2]

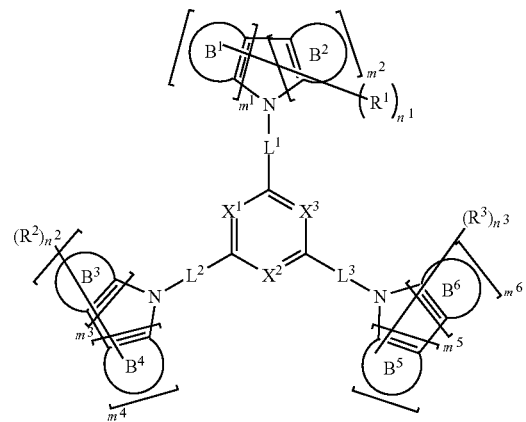

wherein, in Chemical Formula 2,
$X^1$ to $X^3$ are each independently N or $CR^a$, in which $R^a$ is hydrogen, a substituted or unsubstituted C1 to C30 alkyl group, a substituted or unsubstituted C2 to C30 alkenyl group, a substituted or unsubstituted C2 to C30 alkynyl group, a substituted or unsubstituted C6 to C30 aryl group, or a substituted or unsubstituted C2 to C40 heterocycle,
$B^1$ to $B^6$ are each independently a C6 to C30 aromatic ring,
$L^1$ to $L^3$ are each independently a single bond, a substituted or unsubstituted C6 to C30 arylene group, or a combination thereof,
$R^1$ to $R^3$ are each independently a substituted or unsubstituted C1 to C30 alkyl group, a substituted or unsubstituted C2 to C30 alkenyl group, a substituted or unsubstituted C2 to C30 alkynyl group, a substituted or unsubstituted C6 to C30 aryl group, a substituted or unsubstituted C2 to C30 heterocyclic group, or a combination thereof,
$m^1$ to $m^6$ are each independently 0 or 1, and
$n^1$ to $n^3$ are each independently an integer of 0 to 4.

2. The hardmask composition as claimed in claim 1, wherein $X^1$ to $X^3$ are the same.

3. The hardmask composition as claimed in claim 1, wherein $B^1$ to $B^6$ are each independently a group of Group 1:

[Group 1]

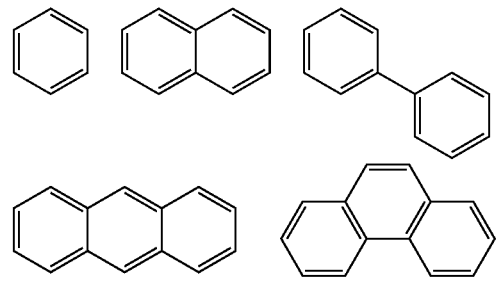

31
-continued

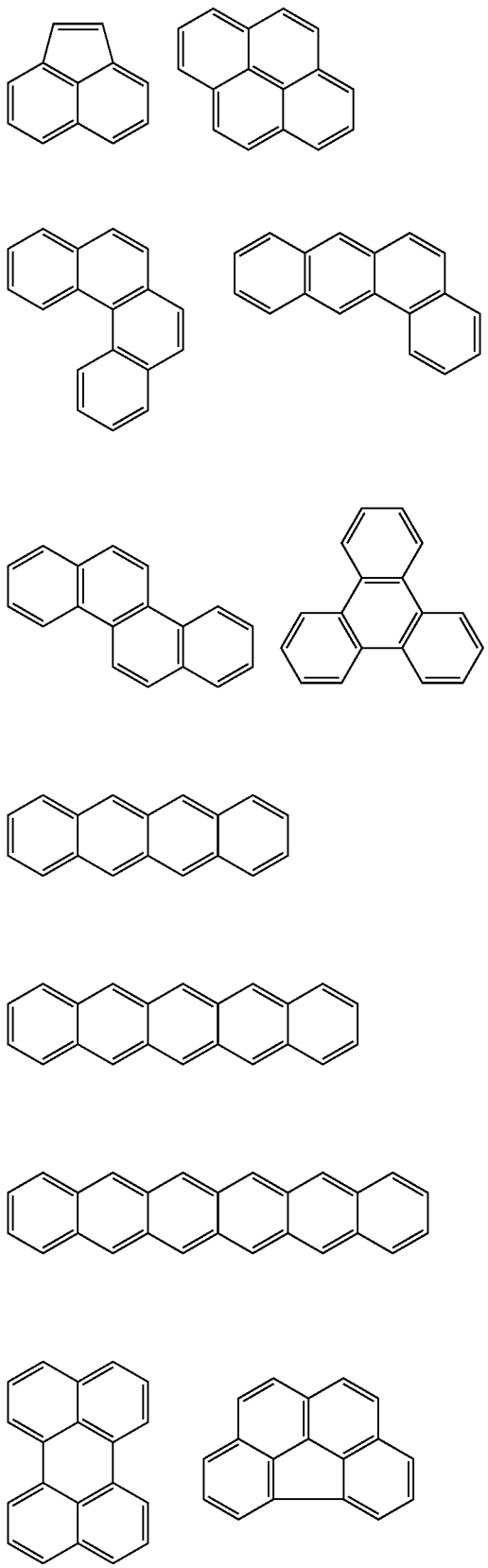

32
-continued

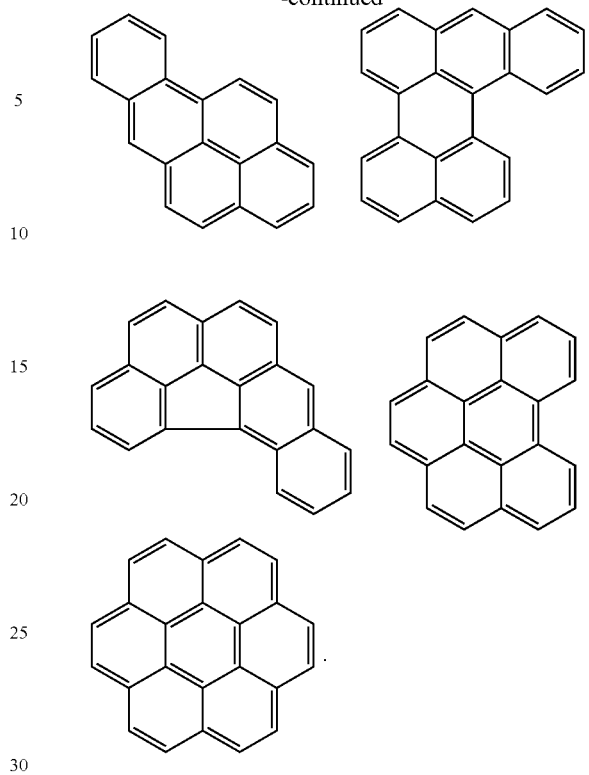

4. The hardmask composition as claimed in claim 1, wherein $L^1$ to $L^3$ are each independently a single bond, a substituted or unsubstituted phenylene group, or a divalent group including substituted or unsubstituted benzene moieties bonded through a single bond.

5. The hardmask composition as claimed in claim 1, wherein $L^1$ to $L^3$ are each independently a single bond, a substituted or unsubstituted phenylene group, a substituted or unsubstituted biphenylene group, a substituted or unsubstituted terphenylene group, a substituted or unsubstituted quaterphenylene group, or a substituted or unsubstituted quinquephenylene group.

6. The hardmask composition as claimed in claim 1, wherein:
 $L^1$ to $L^3$ are each independently a group represented by Chemical Formula 3:

[Chemical Formula 3]

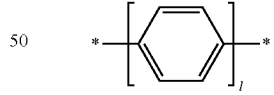

in Chemical Formula 3,
l is an integer of 0 to 4, and
* is a linking point with other moieties in the compound represented by Chemical Formula 1.

7. The hardmask composition as claimed in claim 1, wherein:
at least one of $m^1$ and $m^2$ is 1,
at least one of $m^3$ and $m^4$ is 1, and
at least one of $m^5$ and $m^6$ is 1.

8. The hardmask composition as claimed in claim 1, wherein:
the compound represented by Chemical Formula 2 is represented by Chemical Formula 4, Chemical Formula 5, or Chemical Formula 6:

[Chemical Formula 4]

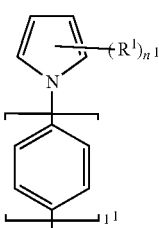

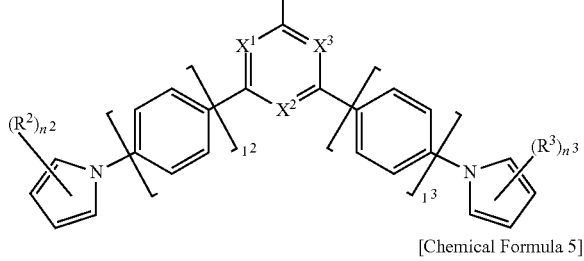

[Chemical Formula 5]

[Chemical Formula 6]

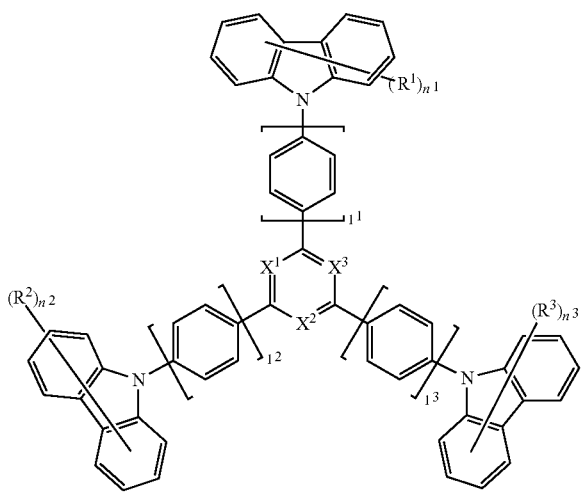

in Chemical Formulas 4 to 6, $X^1$ to $X^3$ are each independently N or $CR^a$, in which $R^a$ is hydrogen, a substituted or unsubstituted C1 to C30 alkyl group, a substituted or unsubstituted C2 to C30 alkenyl group, a substituted or unsubstituted C2 to C30 alkynyl group, a substituted or unsubstituted C6 to C30 aryl group, a substituted or unsubstituted C2 to C30 heterocyclic group, or a combination thereof, $R^1$ to $R^3$ are each independently a substituted or unsubstituted C1 to C30 alkyl group, a substituted or unsubstituted C2 to C30 alkenyl group, a substituted or unsubstituted C2 to C30 alkynyl group, a substituted or unsubstituted C6 to C30 aryl group, a substituted or unsubstituted C2 to C30 heterocyclic group, or a combination thereof, and $l^1$ to $l^3$ and $n^1$ to $n^3$ are each independently an integer of 0 to 4.

9. The hardmask composition as claimed in claim 1, wherein:
the compound represented by Chemical Formula 2 is a first compound, and
the polymer includes a structural unit obtained by a reaction of a reaction mixture including the first compound and a second compound, the second compound being different from the first compound and including a carbonyl moiety, an ether moiety, or a combination thereof.

10. The hardmask composition as claimed in claim 9, wherein
the second compound comprises
at least one aldehyde group; or
at least two alkyl groups substituted with a substituted or unsubstituted C1 to C30 alkoxy group, a substituted or unsubstituted C2 to C30 alkenyloxy group, a substituted or unsubstituted C2 to C30 alkynyloxy group, or a combination thereof.

11. The hardmask composition as claimed in claim 9, wherein:
the second compound is represented by Chemical Formula 7 or Chemical Formula 8,

[Chemical Formula 7]

in Chemical Formula 7, A is hydrogen, a substituted or unsubstituted C6 to C40 aromatic ring, a substituted or unsubstituted C2 to C30 heterocycle, or a combination thereof,

[Chemical Formula 8]

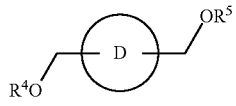

in Chemical Formula 8,
D is a substituted or unsubstituted C6 to C40 aromatic ring, and
$R^4$ and $R^5$ are each independently a substituted or unsubstituted C1 to C30 alkyl group, a substituted or unsubstituted C2 to C30 alkenyl group, a substituted or unsubstituted C2 to C30 alkynyl group or a combination thereof.

12. The hardmask composition as claimed in claim 11, wherein:
A is hydrogen or a substituted or unsubstituted group of a compound of Group 2:

[Group2]

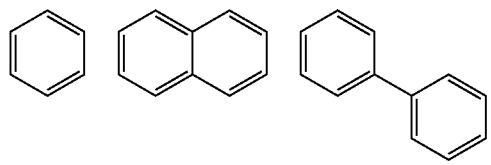
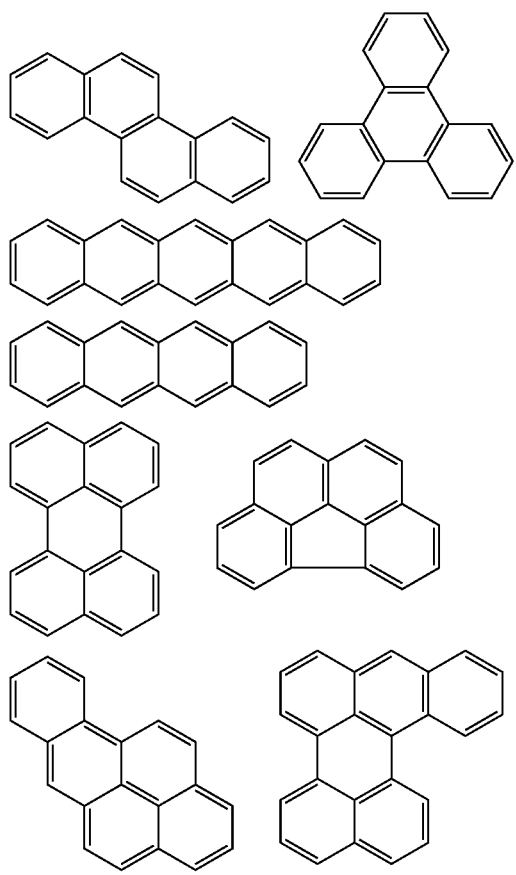
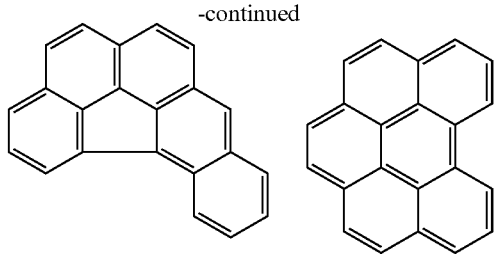
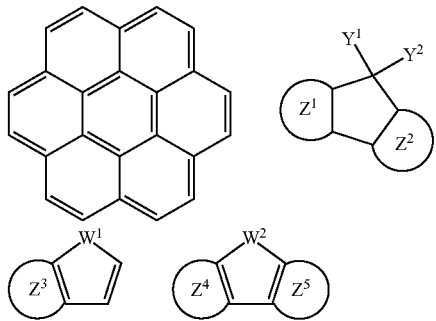

in Group 2,

Y$^1$ and Y$^2$ are each independently hydrogen, a substituted or unsubstituted C6 to C30 aryl group, a substituted or unsubstituted C2 to C30 heterocyclic group, or a combination thereof, Z$^1$ to Z$^5$ are each independently a substituted or unsubstituted C6 to C30 aromatic ring, and W$^1$ and W$^2$ are each independently BR$^b$, NR$^c$, O, S, PR$^d$, or P(=O)R$^e$, in which R$^b$ to R$^e$ are each independently hydrogen, a substituted or unsubstituted C1 to C30 alkyl group, a substituted or unsubstituted C2 to C30 alkenyl group, a substituted or unsubstituted C2 to C30 alkynyl group, a substituted or unsubstituted C1 to C30 heteroalkyl group, a substituted or unsubstituted C3 to C30 cycloalkyl group, a substituted or unsubstituted C3 to C30 cycloalkenyl group, a substituted or unsubstituted C6 to C30 aryl group, a substituted or unsubstituted C2 to C30 heterocyclic group, or a combination thereof.

13. The hardmask composition as claimed in claim 11, wherein:

D is a substituted or unsubstituted group of Group 3:

[Group 3]

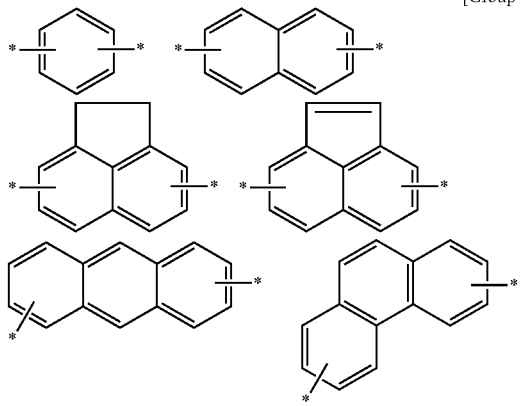

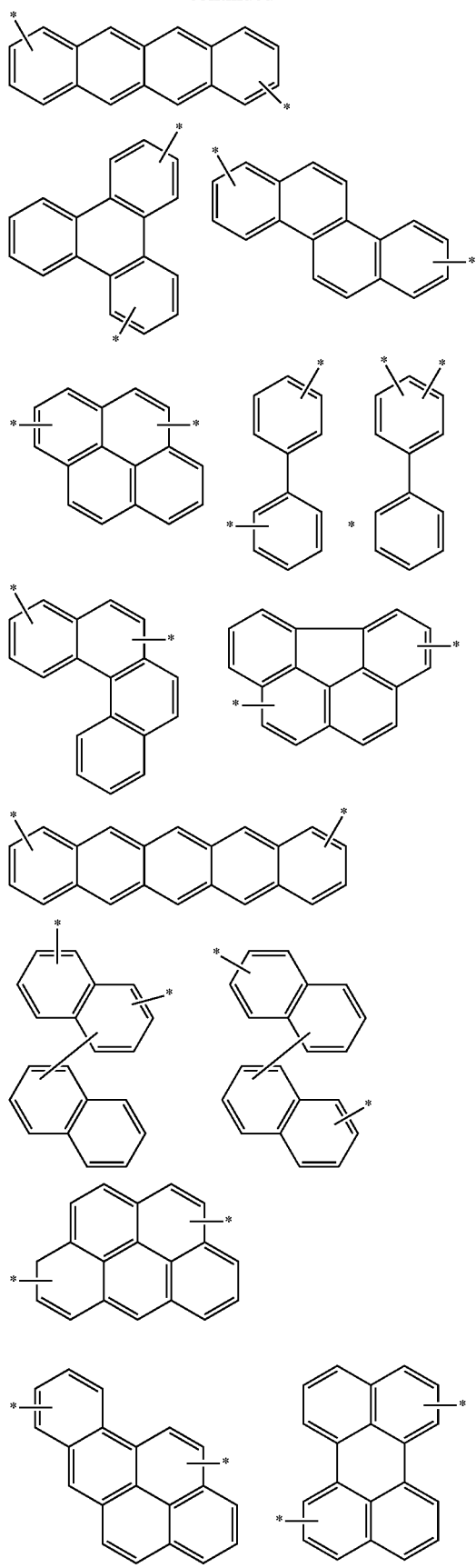
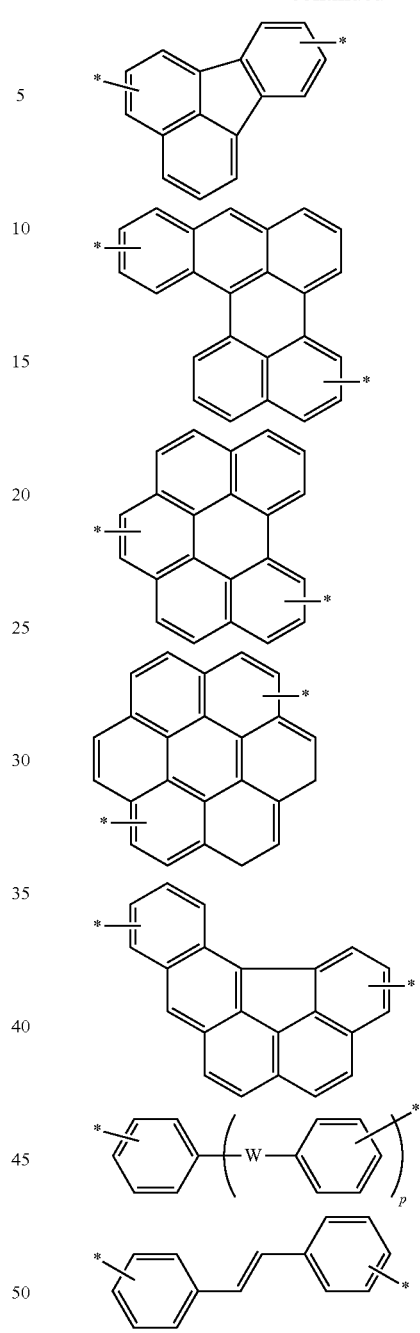

in Group 3,

W is a single bond, oxygen (—O—), sulfur (—S—), —SO$_2$—, a substituted or unsubstituted ethenylene, carbonyl(—C(=O)—), CR$^g$R$^h$, NR$^i$, or a combination thereof, in which R$^g$ to R$^i$ are each independently hydrogen, a halogen, a carboxyl group, a substituted or unsubstituted C2 to C30 oxoalkyl group, a substituted or unsubstituted C1 to C30 alkoxycarbonyl group, a substituted or unsubstituted C1 to C30 alkoxy group, a substituted or unsubstituted C1 to C10 alkyl group, a substituted or unsubstituted C1 to C30 alkenyl group, a substituted or unsubstituted C1 to C30 alkynyl group, a substituted or unsubstituted C1 to C30 heteroalkyl group, a substituted or unsubstituted C3 to C30 cycloalkyl group, a substituted or unsubstituted C3 to C30 cycloalkenyl group, a substituted or unsubstituted C6 to C30 aryl group, a substituted or unsubstituted C3 to C30 heterocyclic group, or a combination thereof, p is an integer of 1 to 30, and

* is a linking point with other moieties in the compound represented by Chemical Formula 8.

14. The hardmask composition as claimed in claim 11, wherein $R^4$ and $R^5$ are each independently a substituted or unsubstituted methyl group, a substituted or unsubstituted ethyl group, a substituted or unsubstituted propyl group, a substituted or unsubstituted butyl group, a substituted or unsubstituted pentyl group, a substituted or unsubstituted hexyl group, a substituted or unsubstituted ethenyl group, a substituted or unsubstituted propenyl group, a substituted or unsubstituted butenyl group, a substituted or unsubstituted pentenyl group, a substituted or unsubstituted hexenyl group, a substituted or unsubstituted ethynyl group, a substituted or unsubstituted propynyl group, a substituted or unsubstituted butynyl group, a substituted or unsubstituted pentynyl group, a substituted or unsubstituted hexynyl group, or a combination thereof.

15. The hardmask composition as claimed in claim 9, wherein the reaction mixture further includes a third compound that is different from the first compound and different from the second compound, the third compound including a substituted or unsubstituted C6 to C40 aromatic ring, a substituted or unsubstituted C2 to C30 heterocyclic ring, or a combination thereof.

16. The hardmask composition as claimed in claim 15, wherein the third compound includes a C6 to C40 aromatic ring that is unsubstituted or substituted with a hydroxyl group, an amine group, a substituted or unsubstituted C1 to C30 alkoxy group, or a combination thereof.

17. A method of forming patterns, the method comprising:
applying the hardmask composition as claimed in claim 1 on a material layer and heat-treating the resultant to form a hardmask layer, forming a photoresist layer on the hardmask layer, exposing and developing the photoresist layer to form a photoresist pattern, selectively removing the hardmask layer using the photoresist pattern to expose a portion of the material layer, and etching an exposed portion of the material layer.

* * * * *